(12) United States Patent
Yamazaki et al.

(10) Patent No.: US 12,122,078 B2
(45) Date of Patent: Oct. 22, 2024

(54) MOLDED ARTICLE, ELECTRICAL PRODUCT AND METHOD FOR PRODUCING MOLDED ARTICLE

(71) Applicant: NISSHA CO., LTD., Kyoto (JP)

(72) Inventors: Seiichi Yamazaki, Kyoto (JP); Toshihiro Higashikawa, Kyoto (JP); Hitoshi Hirai, Kyoto (JP)

(73) Assignee: NISSHA CO., LTD., Kyoto (JP)

( * ) Notice: Subject to any disclaimer, the term of this patent is extended or adjusted under 35 U.S.C. 154(b) by 0 days.

(21) Appl. No.: 17/766,550

(22) PCT Filed: Jul. 29, 2020

(86) PCT No.: PCT/JP2020/029124
§ 371 (c)(1),
(2) Date: Apr. 5, 2022

(87) PCT Pub. No.: WO2021/075125
PCT Pub. Date: Apr. 22, 2021

(65) Prior Publication Data
US 2024/0051202 A1 Feb. 15, 2024

(30) Foreign Application Priority Data
Oct. 18, 2019 (JP) .................................. 2019-191285

(51) Int. Cl.
*H05K 1/02* (2006.01)
*B29C 45/14* (2006.01)
(Continued)

(52) U.S. Cl.
CPC .. *B29C 45/14639* (2013.01); *B29C 45/14008* (2013.01); *B29C 45/1418* (2013.01);
(Continued)

(58) Field of Classification Search
CPC .... H05K 5/0026; H05K 5/003; H05K 5/0034; H05K 1/028; H05K 1/0281;
(Continued)

(56) References Cited

U.S. PATENT DOCUMENTS 5,754,398 A * 5/1998 Glovatsky ............ H05K 3/0058
264/249
8,441,117 B2 * 5/2013 Soyano ................... H01L 24/37
257/E23.188

(Continued)

FOREIGN PATENT DOCUMENTS

| JP | 2014-35805 A | 2/2014 |
| JP | 2017-217871 A | 12/2017 |
| WO | 2013/180132 A1 | 12/2013 |

OTHER PUBLICATIONS

International Search Report dated Oct. 13, 2020 issued in corresponding PCT/JP2020/029124 application (2 pages).

*Primary Examiner* — Hoa C Nguyen
(74) *Attorney, Agent, or Firm* — Millen, White, Zelano & Branigan P.C.; William F. Nixon

(57) ABSTRACT

Object
There is provided a molded article or an electrical product in which layout of a member up to an external connection terminal for electrical connection of a circuit film integrally molded with the molded body is easy.
Solution means
A molded body 30 includes one main surface 31 with which a circuit film 20 is integrally molded, and another main surface 32 facing the one main surface 31. A flexible printed wiring board 40 includes an internal connection terminal 41 electrically connected to an electrical circuit of the circuit film 20, an external connection terminal 42 exposed outside from the other main surface 32 of the molded body 30, and a flexible wiring line 43 connected to the inner connection
(Continued)

terminal 41 and the external connection terminal 42, passing through an inside of the molded body 30, and extending so as to reach the other main surface 32.

16 Claims, 47 Drawing Sheets

(51) Int. Cl.
    *H05K 3/00*       (2006.01)
    *B29L 31/34*     (2006.01)

(52) U.S. Cl.
    CPC ....... *B29C 45/14819* (2013.01); *H05K 1/028* (2013.01); *H05K 3/0014* (2013.01); *B29C 2045/14245* (2013.01); *B29L 2031/3425* (2013.01); *H05K 2201/09118* (2013.01); *H05K 2203/1305* (2013.01)

(58) Field of Classification Search
    CPC .. H05K 2201/09118; H05K 2203/1327; B29C 45/14639; B29C 45/14008; B29C 45/14819
    See application file for complete search history.

(56) References Cited

U.S. PATENT DOCUMENTS

| | | | |
|---|---|---|---|
| 10,154,602 | B2 | 12/2018 | Isoda et al. |
| 10,383,234 | B2 | 8/2019 | Yamazaki et al. |
| 2010/0271265 | A1* | 10/2010 | Sung ........................ H01Q 1/40 425/577 |
| 2014/0043771 | A1* | 2/2014 | Isoda ...................... G06F 3/041 361/728 |
| 2016/0366779 | A1 | 12/2016 | Isoda et al. |
| 2018/0228032 | A1 | 8/2018 | Yamazaki et al. |
| 2020/0413538 | A1* | 12/2020 | Gipson ................ H05K 7/1427 |

\* cited by examiner

MOLDED ARTICLE, ELECTRICAL PRODUCT AND METHOD FOR PRODUCING MOLDED ARTICLE

TECHNICAL FIELD

The present invention relates to a molded article to which a circuit film is integrally molded, an electrical product provided with the molded article, and a method for manufacturing the molded article.

BACKGROUND ART

A component module described in Patent Document 1 (JP 5484529 B) is, for example, a molded article in which a touch sensor as a circuit film and a resin portion as a molded body are integrally molded. The component module of Patent Document 1 includes a flexible printed wiring board for electrical connection between an electrical device located outside the component module and the touch sensor. By connecting an external connection terminal of the flexible printed wiring board to the electrical device, the touch sensor and the electrical device are electrically connected via the flexible printed wiring board.

CITATION LIST

Patent Literature

Patent Document 1: JP 5484529 B

SUMMARY OF INVENTION

Technical Problem

However, in the component module described in Patent Document 1, the resin portion is molded by injection molding using a mold, and thus the flexible printed wiring board is drawn out of the resin portion from an end portion of the resin portion.

As in the component module described in Patent Document 1, when the flexible printed wiring board is drawn out from the end portion of the resin portion, handling of the flexible printed wiring board is bothered in the case of using the molded article in some cases. For example, there may be a case where the component module is used for a portion of a component of a chassis of an electrical product and the electrical device connected to the touch sensor is stored in an interior space of the chassis of the electrical product. In such a case, with the component module of Cited Document 1, the flexible printed wiring board protruding from the end portion of the component module is an obstacle. Therefore, to guide the external connection terminal of the flexible printed wiring board to the internal space of the electrical product, for example, a clearance through which the flexible printed wiring board is passed is required to be provided between the end portion of the component module and another portion of the chassis around it. In the case of using a portion of the circuit film as an external wiring line portion instead of the flexible printed wiring board, handling of a wiring line to the external connection terminal of the external wiring line portion is similarly difficult.

An object of the present invention is to provide a molded article or an electrical product in which handling of a member up to an external connection terminal for electrical connection of a circuit film integrally molded with a molded body is easy. An object of the present invention is to provide a method for manufacturing the molded article.

Solution to Problem

Some aspects will be described below as means to solve the problems. These aspects can be combined arbitrarily as necessary.

A molded article according to one aspect of the present invention includes a circuit film, a molded body, and a flexible printed circuit board or a flexible flat cable. The circuit film includes an insulating film and an electrical circuit formed on the insulating film. The molded body has one main surface with which the circuit film is integrally molded and another main surface facing the one main surface. The flexible printed wiring board or the flexible flat cable includes an internal connection terminal, an external connection terminal, and a flexible wiring line. The internal connection terminal is electrically connected to the electrical circuit of the circuit film. The external connection terminal is exposed outside from the other main surface of the molded body. The wiring line is connected to the inner connection terminal and the external connection terminal. The wiring line passes through an inside of the molded body and extends so as to reach the other main surface.

With the molded article having such a configuration, the flexible printed circuit board or the flexible flat cable is caused to pass through the inside of the molded body. Accordingly, an end portion as a periphery of the one main surface and the other main surface of the molded body need not be used for handling of the flexible printed circuit board or the flexible flat cable.

A molded article according to another aspect of the present invention includes a circuit film and a molded body. The circuit film includes a main body portion and an external wiring line portion. The main body portion is disposed on the one main surface. The external wiring line portion has a width narrower than a width of the main body portion. The external wiring line portion is bent in a direction intersecting with the main body portion. The external wiring line portion includes an external connection terminal. The external connection terminal passes through an inside of the molded body, extends so as to reach the other main surface, and is exposed outside from the other main surface of the molded body.

With the molded article having such a configuration, the external wiring line portion of the circuit film is caused to pass through the inside of the molded body. Accordingly, the end portion as the periphery of the one main surface and the other main surface of the molded body need not be used for handling of the external wiring line portion.

The molded article can be configured as follows. The circuit film includes the electrical circuits on both surfaces of the insulating film. The flexible printed wiring board or the flexible flat cable includes the internal connection terminal electrically connected to the electrical circuit on each of the surfaces of the insulating film.

Compared with the use of the circuit film including the electrical circuit on only one surface by the same area, the use of both surfaces in the molded article thus configured allows easily forming the many electrical circuits on the insulating film.

The molded article can further include a decorative film insulated on a side facing the circuit film. The decorative film is disposed on the one main surface to cover at least a portion of the circuit film and decorate an appearance. The decorative film is integrally molded with the molded body.

With the molded article thus configured, by covering at least a portion of the circuit film with the decorative film that decorates the appearance, the circuit film can be protected with the decorative film while the appearance is beautifully adjusted.

The molded article can be configured such that the external connection terminal is substantially a portion of the other main surface, and the external connection terminal is fixed with the molded body.

With the molded article thus configured, a position of the external connection terminal is fixed, and therefore connection to the external connection terminal is easy.

An electrical product according to one aspect of the present invention includes a chassis including the molded article described above and an electrical device. The electrical device is disposed in the chassis and connected to the external connection terminal in the chassis. The end portion as the periphery of the one main surface and the other main surface of the molded body need not be used for handling of the flexible printed wiring board, the flexible flat cable, or the external wiring line portion of the circuit film. This allows the electrical product to improve sealing properties of the chassis.

A method for manufacturing molded article according to one aspect of the present invention includes: setting a circuit film including an insulating film and an electrical circuit formed on the insulating film to a first mold; storing a flexible printed wiring board, a flexible flat cable, or an external wiring line portion of the circuit film standing from the circuit film in a storage space provided with a storage pin, clamping the first mold and a second mold, and separating a cavity formed with the first mold and the second mold from the storage space; and injecting a molten resin into the cavity and forming a molded body integrally molded with the circuit film.

In the method for manufacturing molded article having such a configuration, the flexible printed wiring board, the flexible flat cable, or the external wiring line portion of the circuit film is stored in the storage space, and injection molding of the molded body can be performed while the flexible printed wiring board, the flexible flat cable, or the external wiring line portion is treated so as not to be immersed in the molten resin. This allows manufacturing the molded article in which the flexible printed wiring board, the flexible flat cable, or the external wiring line portion passes through the inside of the molded body. Additionally, the manufacturing method separates the cavity from the storage space, thus preventing the molten resin from entering into the storage space and causing a difficulty in the subsequent injection molding.

The method for manufacturing molded article allows including: injecting the molten resin in a first state in which the storage pin is fitted to the flexible printed wiring board, the flexible flat cable, or the external wiring line portion when the molded body is formed; and further injecting a molten resin into a gap generated by retreat of the storage pin in a second state in which the storage pin is retreated from the first state.

The method for manufacturing molded article thus configured allows preventing a portion where the storage pin is disposed in the molded body from being depressed.

A method for manufacturing molded article according to another aspect of the present invention includes: bending an external wiring line portion of a circuit film that includes an insulating film and an electrical circuit formed on the insulating film, a flexible printed wiring board, or a flexible flat cable so as to have a shape after molding by pressing; setting the circuit film to a first mold; clamping the first mold and a second mold to form a cavity, and supporting the flexible printed wiring board, the flexible flat cable, or the external wiring portion with a storage pin so as to stand from the circuit film in the cavity; and when a molten resin is injected into the cavity to form a molded body integrally molded with the circuit film, further injecting a molten resin in a gap generated by retreat of the storage pin with the retreated storage pin, passing the flexible printed wiring board, the flexible flat cable, or the external connection terminal through an inside of the molded body, extending the flexible printed wiring board, the flexible flat cable, or the external connection terminal so as to reach the other main surface where the circuit film is disposed and that faces the one main surface of the molded body, and exposing an external connection terminal of the flexible printed wiring board, an external connection terminal of the flexible flat cable, or an external connection terminal of the external wiring line portion as a portion of the other main surface.

The method for manufacturing molded article having such a configuration allows performing the injection molding of the molded body while the flexible printed wiring board, the flexible flat cable, or the external connection terminal is supported by the storage pin so as not to be immersed in the molten resin. This allows manufacturing the molded article in which the flexible printed wiring board, the flexible flat cable, or the external wiring line portion passes through the inside of the molded body. This also allows preventing the portion where the storage pin is disposed in the molded body from being depressed.

The method for manufacturing molded article allows including: crimping a decorative film and the circuit film; setting the decorative film to the first mold together with the circuit film; and injecting a molten resin into the cavity, and applying heat and pressure to the decorative film and the circuit film simultaneously with integrally molding the decorative film with the molded body together with the circuit film.

The method for manufacturing molded article thus configured can improve an adhesion strength of the decorative film and the circuit film integrally molded with the molded body.

The method for manufacturing molded article includes: crimping the circuit film and the flexible printed wiring board with an anisotropic conductive film or an anisotropic conductive paste; setting the flexible printed wiring board to the first mold together with the circuit film; and injecting a molten resin into the cavity, and applying heat and pressure to the flexible printed wiring board and the circuit film with the molten resin simultaneously with integrally molding the flexible printed wiring board with the molded body together with the circuit film.

The method for manufacturing molded article thus configured can improve an adhesion strength of the flexible printed wiring board and the circuit film integrally molded with the molded body.

Advantageous Effects of Invention

The molded article or the electrical product according to the present invention allows easing handling of a member up to the external connection terminal for electrical connection of the circuit film integrally molded with the molded body. The method for manufacturing molded article according to the present invention allows easily manufacturing the molded article in which handling of the member up to the external connection terminal for electrical connection of the circuit film integrally molded with the molded body is easy.

DESCRIPTION OF EMBODIMENTS

First Embodiment

Figure 1:
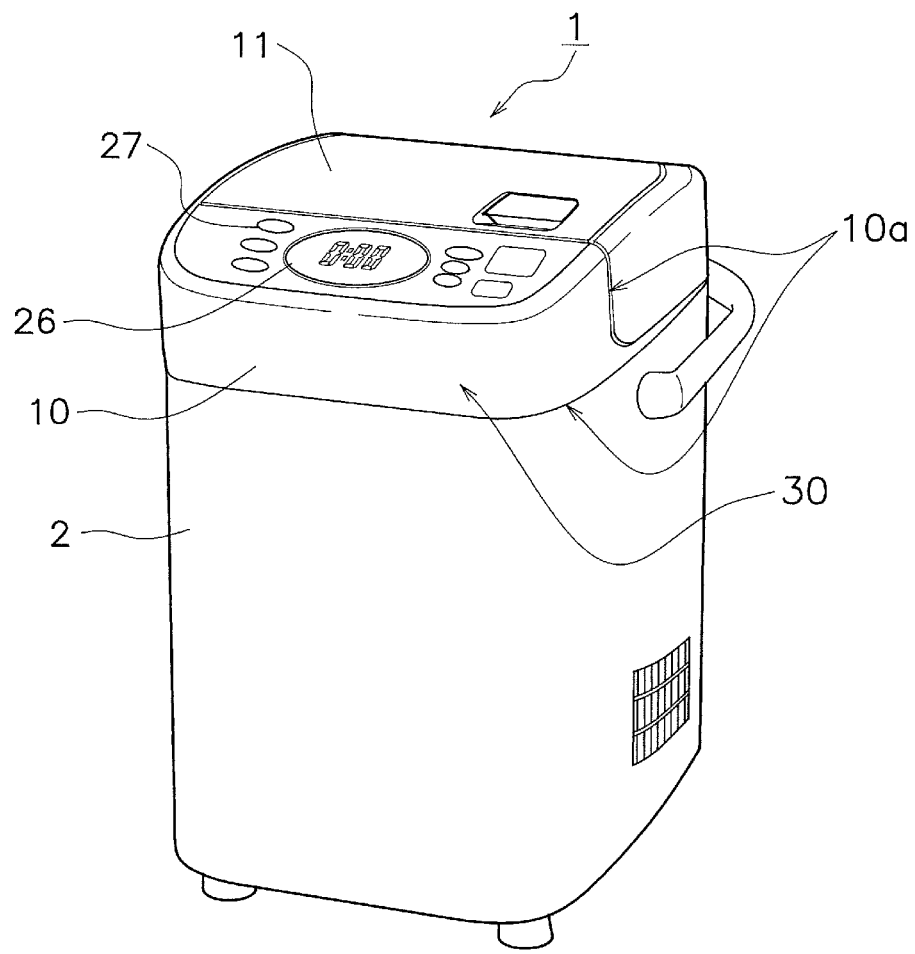
FIG. 1 is a perspective view illustrating an example of an electrical product to which a molded article according to the present invention is applied.

A molded article, an electrical product, and a method for manufacturing molded article according to the first embodiment of the present invention will be described below with reference to the drawings. FIG. 1 illustrates an appearance of a breadmaker to which the molded article according to the first embodiment is mounted. A breadmaker 1 illustrated in FIG. 1 is a device that can bake breads by opening a lid 11 and placing a bread dough. The breadmaker 1 illustrated in FIG. 1 is an example of the electrical product according to the present invention. However, the electrical product to which the present invention is applied is not limited to the breadmaker 1. Examples of the electrical products include a washing machine, a refrigerator, a rice cooker, a dishwasher, video equipment, an acoustic device, a radio, a humidifier, an electric iron, an electric cleaning machine, a telephone, a game machine, a personal computer, an electric stove, a wireless earphone, a headphone, and a medical device, such as a blood pressure gauge and a blood glucose meter. The electrical product is a product that serves a particular function by electrical energy.

Figure 2:
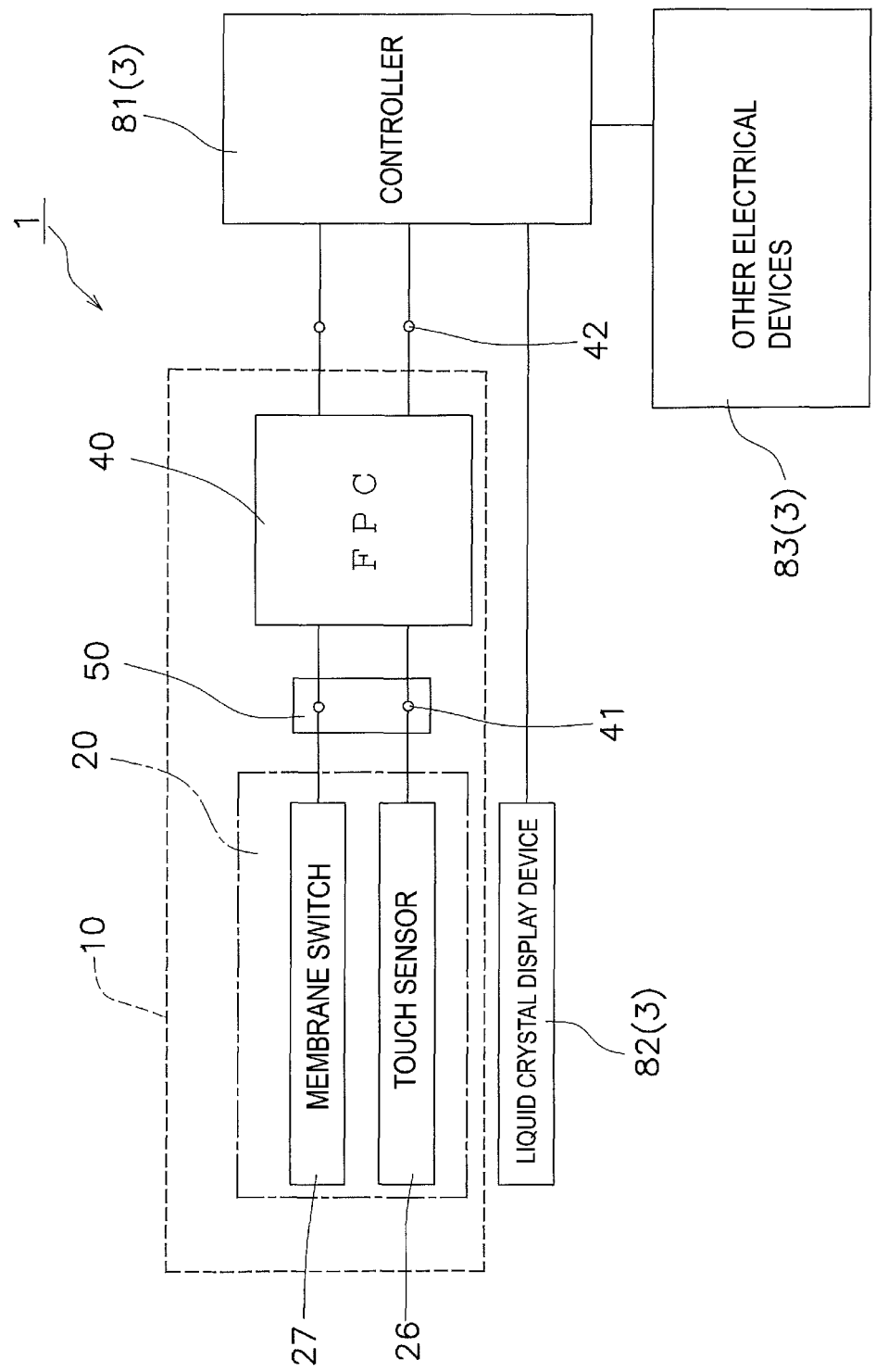
FIG. 2 is a block diagram illustrating an example of connection of the molded article in FIG. 1 and an electrical device.

FIG. 2 illustrates a portion of the electrical device for operating the breadmaker 1. The breadmaker 1 (the electrical product) according to the present invention includes a chassis 2 and an electrical device 3. FIG. 2 illustrates a controller 81, a liquid crystal display device 82, and another electrical device 83 as electrical devices 3. Examples of the other electrical device 83 include a heater and a motor. The electrical device is a device that serves a particular function by electrical energy.

The chassis 2 includes an operation panel 10 as a component constituting a portion of the chassis 2. The breadmaker 1 can bake a bread according to the operation of the operation panel 10. In addition, for example, information about setting of a way of baking a bread can be displayed on the operation panel 10. The operation panel 10 is an example of the molded article according to the present invention.

(1) Overview of Operation Panel 10

Figure 3:
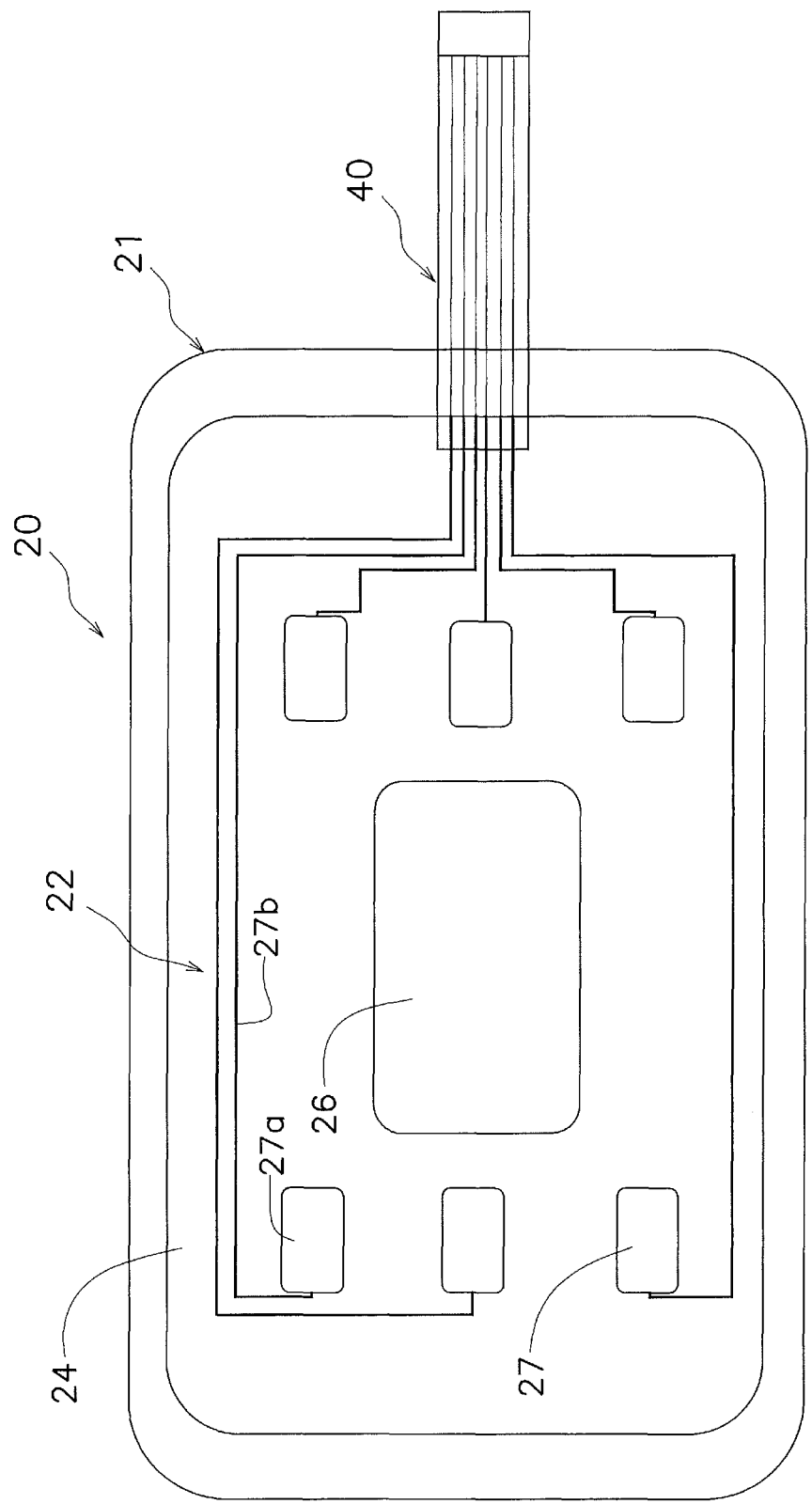
FIG. 3 is a plan view for describing a circuit film illustrated in FIG. 2.

The operation panel 10 of the first embodiment includes a circuit film 20, a molded body 30, and a flexible printed wiring board 40. FIG. 3 schematically illustrates the circuit film 20 and the flexible printed wiring board 40. Note that the flexible printed wiring board is represented as an FPC in the following description in some cases.

The circuit film 20 includes an insulating film 21 and an electrical circuit 22. In FIG. 3, to avoid difficulty in viewing the drawing, illustration of details of, for example, a wiring line of a circuit portion of a touch sensor 26 are omitted. The circuit film 20 includes, as the electrical circuit 22, a circuit portion of the touch sensor 26 and a circuit portion of a membrane switch 27.

The circuit portion of the membrane switch 27 includes, for example, an electrode 27a and a wiring line 27b. The electrical circuit applicable to the present invention is not limited to the circuit portion of the touch sensor 26 and the circuit portion of the membrane switch 27. Examples of the electrical circuit applicable to the present invention include an electrostatic sensor, a heater, and an antenna.

Figure 4:
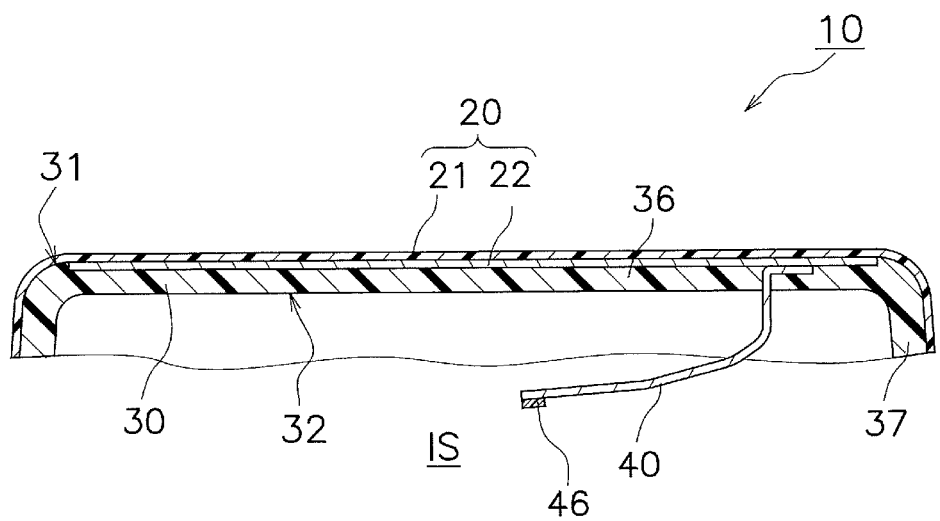
FIG. 4 is a schematic partial cross-sectional view illustrating an example of a molded article according to a first embodiment.

FIG. 4 schematically illustrates a cross-sectional structure of the operation panel 10. As illustrated in FIG. 4, the molded body 30 has an upper wall 36 and a side wall 37 extending around the upper wall 36. Therefore, a shape of the cut surface illustrated in FIG. 4 is a reversed U-shape. Thus, in the first embodiment, the case where the molded body 30 has the three-dimensional shape is described. However, the structure of the molded body according to the present invention is not limited to have the three-dimensional shape, and may have a two-dimensional shape, such as a single flat plate. The molded body 30 includes one main surface 31 and another main surface 32. The one main surface 31 and the other main surface 32 face each other. In the molded body of the first embodiment, the one main surface 31 and the other main surface 32 are arranged with approximately the same interval.

As illustrated in FIG. 4, the circuit film 20 of the operation panel 10 is located on the one main surface 31 of the molded body 30, and is integrally molded with the molded body 30. In the first embodiment, the circuit film 20 includes a design layer 24, and the circuit film 20 decorates an appearance of the operation panel 10. However, in another electrical product to which the present invention is applied, a decorative film 15 (see, for example, FIG. 32A and FIG. 32B) may cover the circuit film 20 and decorate the appearance of the operation panel 10 as will be described in a modified example (8-3) described later. Furthermore, the design layer 24 is not formed in the circuit film 20, but, for example, the insulating film 21 may be an opaque plain film. For example, on the design layer 24, a design indicative of a function of the membrane switch 27 like "ON/OFF," a design like a frame line indicating a range of the touch sensor 26, or a design like a background color that harmonizes with a color of the chassis 2 is provided. The circuit film 20 includes the electrical circuit 22 in contact with the design layer 24. To prevent formation of an unnecessary electrical path of flowing a current from the electrical circuit 22 to the electrical circuit 22 through the design layer 24, the design layer 24 is made of an insulator.

In the molded body 30 in FIG. 4, the one main surface 31 is located outside the breadmaker 1 as the electrical product, and the other main surface 32 is located inside the breadmaker 1. The inside of the chassis 2 of the breadmaker 1 is an internal space IS of the electrical product.

The FPC 40 passes through the inside of the molded body 30 and extends so as to reach the other main surface 32 of the molded body 30. The FPC 40 illustrated in FIG. 4 passes through the molded body 30 and reaches the other main surface 32, and further protrudes from the other main surface 32 to the internal space IS.

Figure 5:
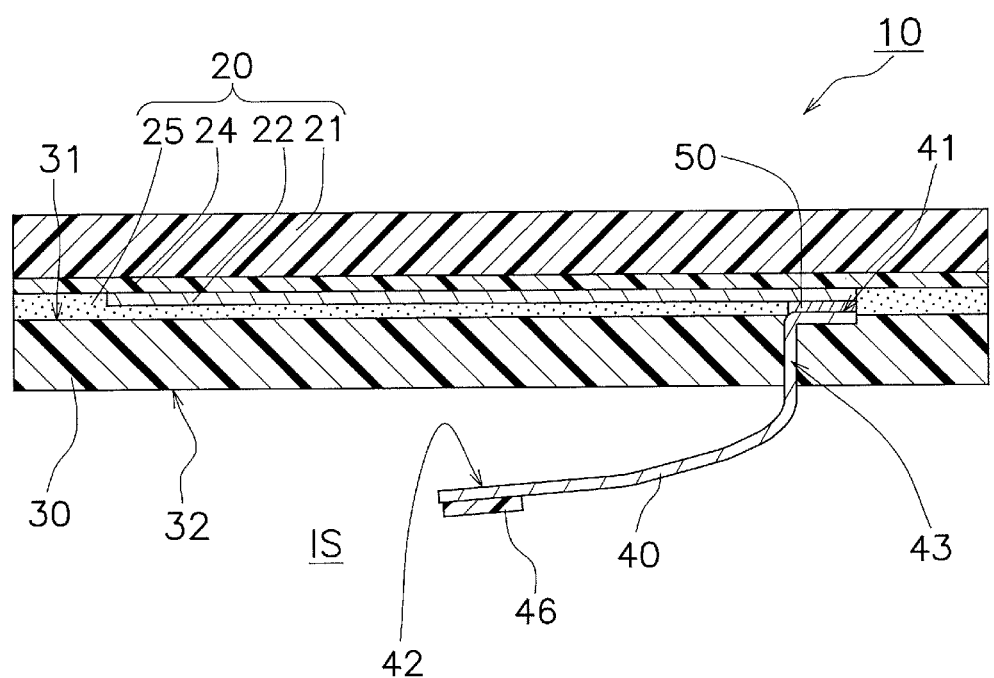
FIG. 5 is a schematic partially enlarged cross-sectional view illustrating an example of the molded article according to the first embodiment.
Figure 6A:
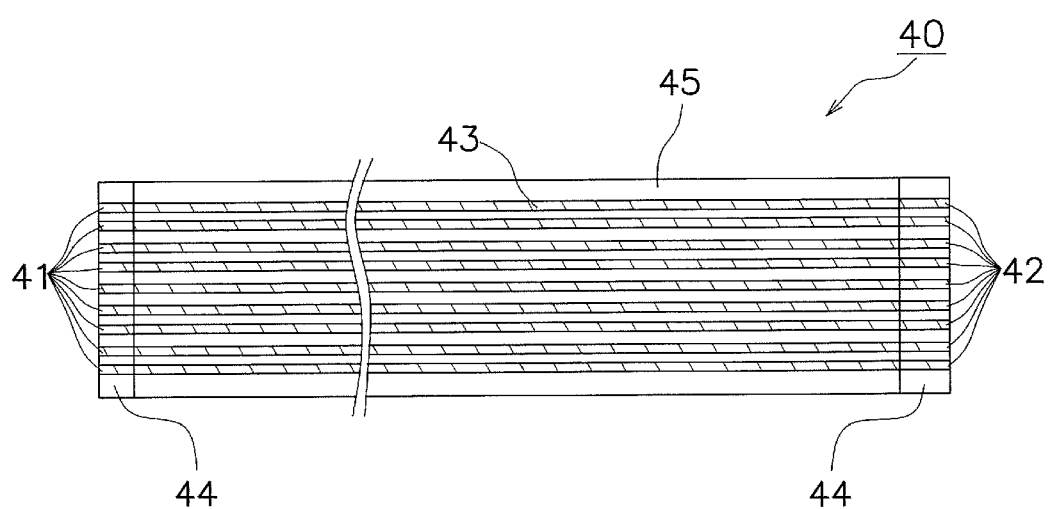
FIG. 6A is a partially cutaway plan view illustrating an example of an FPC illustrated in FIG. 4.
Figure 6B:
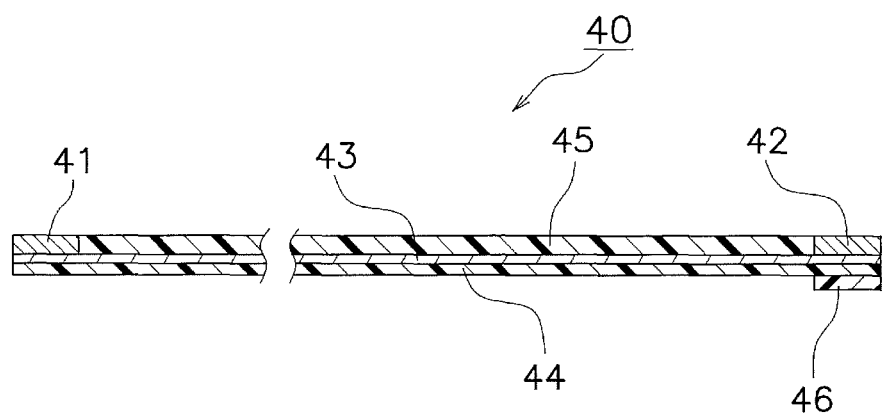
FIG. 6B is a schematic partially cutaway cross-sectional view of the FPC illustrated in FIG. 6A.

FIG. 5 schematically illustrates an enlarged structure around the FPC 40. FIG. 6A is a schematic plan view of the FPC 40, and FIG. 6B is a schematic cross-sectional view of the FPC 40. The FPC 40 includes internal connection terminals 41, external connection terminals 42, and wiring lines 43. The internal connection terminal 41 is a terminal electrically connected to the electrical circuit 22 of the circuit film 20. The electrical circuit 22 of the circuit film 20 to which the internal connection terminals 41 are connected is the circuit portion of the touch sensor 26 and the circuit portion of the membrane switch 27. The external connection terminals 42 are exposed outside from the other main surface 32 of the molded body 30. In the first embodiment, the external connection terminal 42 is in the internal space IS. The wiring lines 43 are flexible conductive lines connected to the internal connection terminals 41 and the external connection terminals 42. The wiring line 43 passes through the inside of the molded body 30 and extends so as to reach the other main surface 32.

(2) Detailed Configuration of Operation Panel 10

(2-1) Circuit Film 20

As illustrated in FIG. 5, the circuit film 20 of the first embodiment includes the insulating film 21, the electrical circuit 22, the design layer 24, and an adhesive layer 25. On the insulating film 21 illustrated in FIG. 5, the design layer 24 is printed. The electrical circuit 22 is printed with the position matched with the printed pattern of the design layer 24. The adhesive layer 25 is printed so as to cover the entire surface excluding a portion of the stacked body formed of the insulating film 21, the design layer 24, and the electrical circuit 22. The adhesive layer 25 is printed with a mask provided such that an adhesive is not applied on a crimped portion in the electrical circuit 22 to which the internal connection terminals 41 of the FPC 40 are connected. A transparent or translucent material is used for the insulating film 21. Note that a top coat layer for enhancing durability may be formed on the outside of the insulating film 21.

For example, a film made of resin, a film made of rubber, a film made of ceramic, or a stacked film of them can be used as the insulating film 21. The material of the film made of resin is, for example, a resin film made of a polyester resin, a polyethylene terephthalate (PET) resin, an acrylic resin, a polycarbonate resin, a polybutylene terephthalate (PBT) resin, a triacetyl cellulose resin, a styrene resin, or an ABS resin, a multilayer film made of an acrylic resin and an ABS resin, or a multilayer film made of an acrylic resin and a polycarbonate resin. A thickness of the film made of resin is selected from a range from, for example, 30 µm to 500 µm.

The electrical circuit 22 is formed by, for example, forming a conductive material on the surface(s) of the insulating film 21 and/or the design layer 24 and then performing patterning. Alternatively, the electrical circuit 22 is formed by, for example, printing a conductive ink on the surface(s) of the insulating film 21 and/or the design layer 24 by thick-film printing. Examples of the conductive material constituting the electrical circuit 22 include a metal material and a semiconductor material. As the metal material, for example, copper, aluminum, carbon, nickel, gold, silver, or tin can be used. Examples of the semiconductor material include metal oxide and a conductive polymer. A transparent electrode may be used for the touch sensor 26. The transparent electrode is formed of, for example, a metal oxide, a transparent conductive polymer, or a transparent conductive ink. Examples of metal oxides include indium tin oxide (ITO) and indium zinc oxide (IZO). An example of a transparent conductive polymer is poly-3,4-ethylenedioxythiophene/polysulfonic acid (PEDOT/PSS). Examples of transparent conductive ink include carbon nanotubes or silver nanofibers compounded in a binder.

The design layer 24 is a layer to express a design, such as a pattern. The design layer 24 is formed by, for example, performing gravure printing or screen printing on the insulating film 21. The materials constituting the design layer 24 include, for example, a resin, such as an acrylic resin, a vinyl chloride vinyl acetate copolymer resin, a thermoplastic urethane resin, or a polyester resin, and a pigment or dye that is added to the resin. The design layer 24 may also have a metallic design formed using, for example, an insulated aluminum paste or mirror ink.

Additionally, the design layer 24 may be disposed on the outer surface of the insulating film 21. The insulating film 21 may be a film that forms fine irregularities to change a texture on the surface of the design layer 24.

The adhesive layer 25 is a layer to adhere the circuit film 20 to the molded body 30. The adhesive layer 25 is preferably formed of an insulating adhesive to ensure the insulating properties of the circuit film 20. For example, a thermoplastic resin can be used for the adhesive layer 25. The thermoplastic resin used for the adhesive layer 25 includes a urethane resin, a polyester resin, a polyamide resin, an acrylic resin, a vinyl chloride vinyl acetate copolymer resin, and a synthetic rubber. The adhesive layer 25 exhibits adhesiveness by heat of a molten resin, and improves the adhesion force between the circuit film and the molded body 30. A thickness of the adhesive layer 25 is, for example, from 2 µm to 20 µm in the film thickness after drying.

(2-2) Molded Body 30

The molded body 30 may be colored or need not be colored, and is molded using a transparent, translucent, or opaque thermoplastic resin or elastomer. As the material of the molded body 30, a general-purpose thermoplastic resin, such as a polystyrene resin, a polyolefin resin, an ABS resin, or an AS resin is preferably used. Besides, a polycarbonate resin, a polyacetal resin, an acrylic resin, a polybutylene terephthalate resin, an engineering resin (for example, a polysulfone resin, a polyphenylene sulfide resin, a polyphenylene oxide resin, and a polyacrylate resin), a polyamide resin, or a urethane, polyester, or styrene elastomer can be used as the material of the molded body 30. Furthermore, natural rubber and synthetic rubber can be used as the material of the molded body 30. A reinforcing material, such as glass fiber or inorganic filler, can be added to the molded body 30.

(2-3) FPC 40

As illustrated in FIG. 6A and FIG. 6B, the FPC 40 forms a conductor pattern including the internal connection terminals 41, the external connection terminals 42, and the wiring lines 43 on a first surface of a base film 44. Further, a cover film 45 is formed so as to cover the first surface of the base film 44 and the wiring lines 43. A reinforcing film 46 is provided on a second surface of the base film 44 on the side opposite to the first surface on which the external connection terminals 42 are formed. The reinforcing film 46 is a film for increasing rigidity of the portion where the external connection terminal 42 is formed.

For example, a film made of resin, a film made of rubber, a film made of ceramic, or a stacked film of them can be used as the base film 44. The film made of resin includes, for example, a film of polyimide, a film of polyamide, a film of polycarbonate, or a film of triacetyl cellulose. As the reinforcing film 46, the similar material used for the base film 44 of the FPC 40 can be used.

As the material of the conductor pattern including the internal connection terminals 41, the external connection terminals 42, and the wiring lines 43, for example, the material similar to the conductive material that can be used for the electrical circuit 22 can be used. As the material of the cover film 45, for example, an insulating material similar to the material that can be used for the base film 44 can be used. The internal connection terminal 41 and the external connection terminal 42 may be formed by, for example, layering another metal, such as nickel and gold, on the main material of the conductive pattern, for example, copper foil by plating. For example, the electrical circuit 22 is formed of a conductive pattern using a conductive ink containing copper or silver by printing, a conductive carbon ink may be printed to coat the external connection terminals 42.

A connector for connection with an external device may be connected to the external connection terminal 42 side of the FPC 40.

(2-4) Anisotropic Conductive Film

As illustrated in FIG. 5, the FPC 40 is connected to the electrical circuit 22 of the circuit film 20 with an anisotropic conductive film 50. The anisotropic conductive film 50 is produced by dispersing conductive particles, which are produced by coating spherical resin surfaces having diameters of 5 to 30 μm with a metal, such as nickel or gold, by plating, into, for example, an epoxy resin or an acrylic resin, and forming the resultant in a film shape. There is also provided a paste-like anisotropic conductive paste produced by dispersing the conductive particles into, for example, synthetic rubber or an acrylic resin adhesive. Both of the anisotropic conductive film 50 and the anisotropic conductive paste can be used for connecting the FPC 40 and the electrical circuit 22. The anisotropic conductive film 50 is placed between the electrical circuit 22 and the internal connection terminals 41 of the FPC 40, and predetermined heat and pressure are applied to ensure electrical connection between the plurality of circuit terminals.

Figure 8:
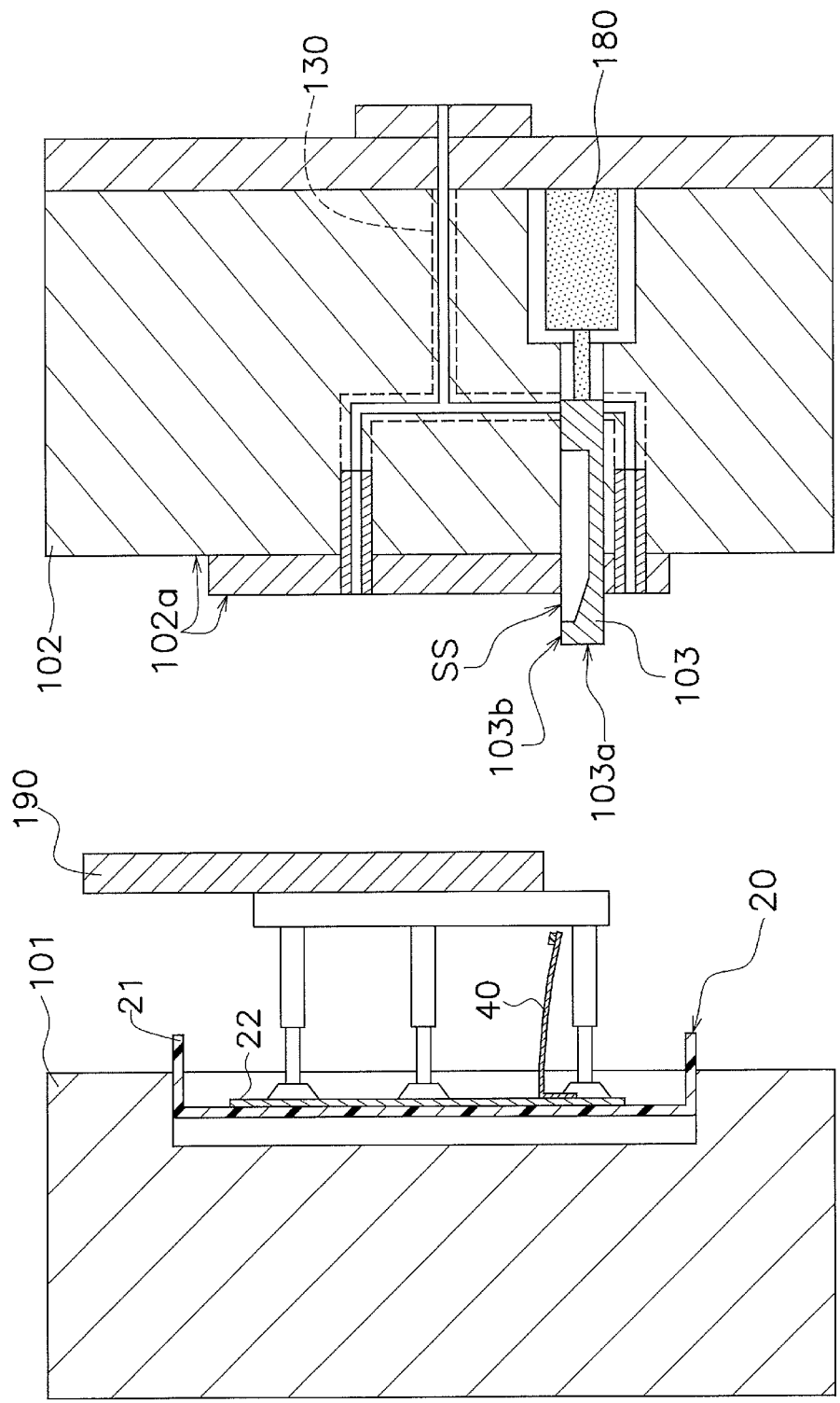
FIG. 8 is a schematic cross-sectional view for describing setting of the circuit film and a decorative film to a first mold in the first embodiment.

(3) Method for Manufacturing Molded Article (3-1) Overview of Method for Manufacturing Molded Article As illustrated in FIG. 8, in a first step of the method for manufacturing molded article, the circuit film 20 is set to a first mold 101. A second mold 102 includes a storage pin 103 for providing a storage space SS. The storage space SS is a space surrounded by the storage pin 103 and the second mold 102. For example, the circuit film 20 includes the insulating film 21 and the electrical circuit 22 formed on the insulating film 21 as illustrated in FIG. 3.

Figure 9:
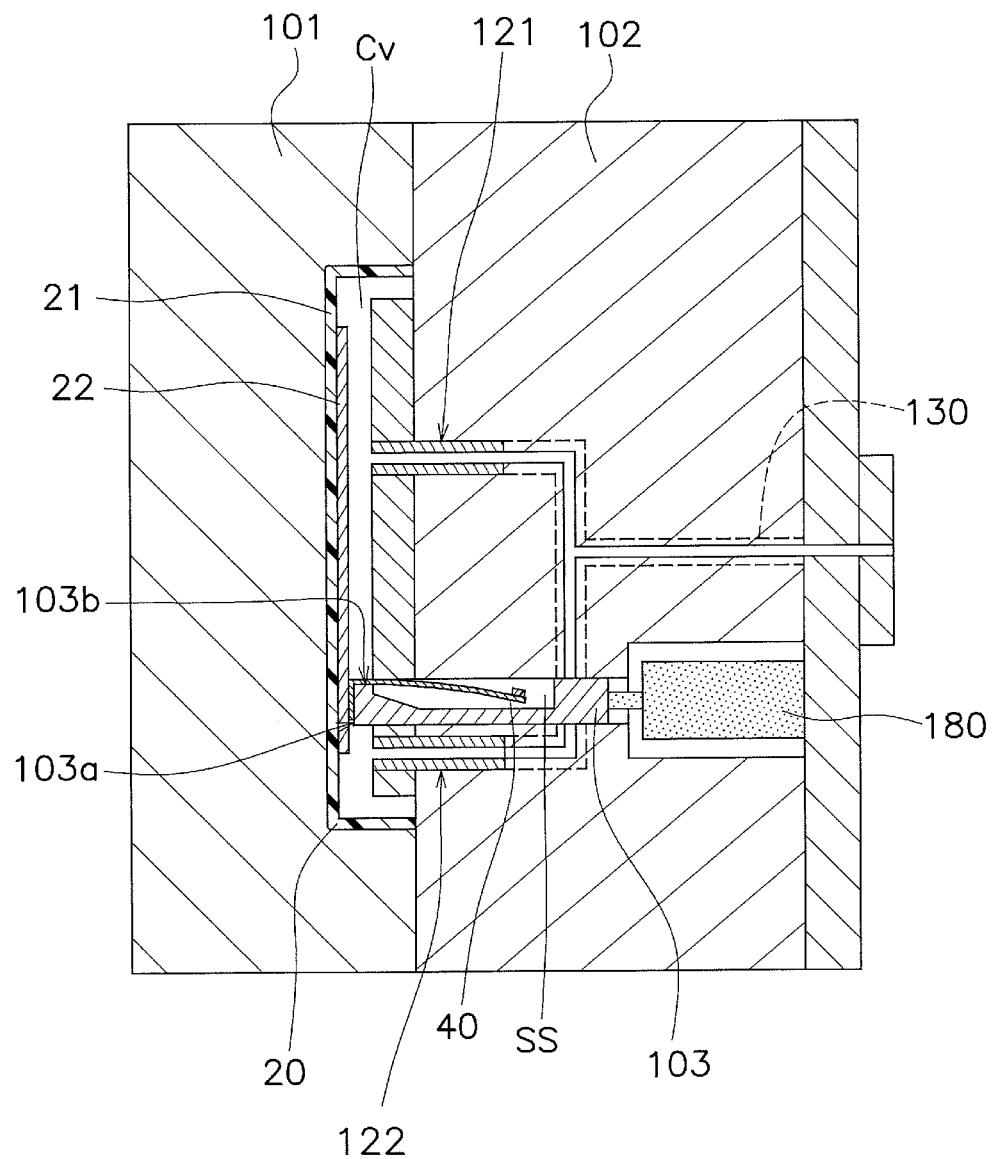
FIG. 9 is a schematic cross-sectional view illustrating a clamped first mold and second mold in the first embodiment.

In a second step, the flexible printed wiring board 40 standing from the circuit film 20 is stored in the storage space SS provided with the storage pin 103. As illustrated in FIG. 9, the first mold 101 and the second mold 102 are clamped. With the first mold 101 and the second mold 102 clamped, a cavity Cv formed with the first mold 101 and the second mold 102 is separated from the storage space SS. The cavity Cv being separated from the storage space SS means that a molten resin 200 injected into the cavity Cv does not flow into the storage space SS. To that end, the cavity Cv and the storage space SS are partitioned by the second mold 102, the storage pin 103, and the flexible printed wiring board 40.

In a third step, as illustrated in FIG. 10, FIG. 11, FIG. 12, FIG. 13, and FIG. 14, the molten resin 200 is injected into the cavity Cv to form the molded body 30 integrally molded with the circuit film 20.

(3-2) Details of Method for Manufacturing Operation Panel 10

The method for manufacturing the operation panel 10 according to the first embodiment will be described in detail.

Figure 7:
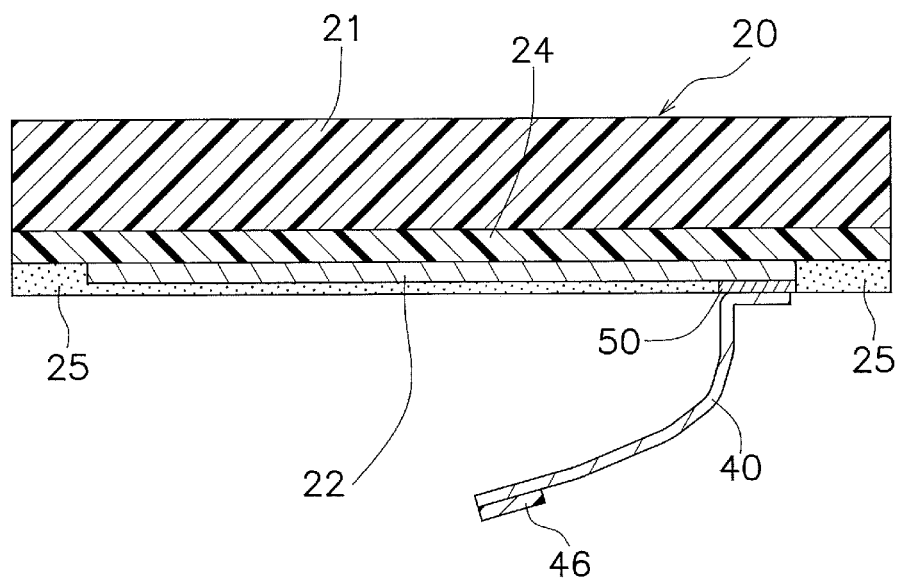
FIG. 7 is a schematic cross-sectional view illustrating an example of the circuit film.

The circuit film 20, the FPC 40, and the anisotropic conductive film 50 illustrated in FIG. 7 are prepared. The FPC 40 is crimped to the circuit film 20 with the anisotropic conductive film 50. The adhesive layer 25 is not printed on the crimped portion with the FPC 40 in the electrical circuit 22, and the circuit is exposed. Thus, after adjusting alignment of the crimped portion where the circuit is exposed and the wiring line portions of the internal connection terminals 41 of the FPC 40, thermocompression bonding is performed on the wiring line portions of the internal connection terminals 41 and the crimped portion in the electrical circuit 22. Here, a case in which the circuit film 20 and the FPC 40 are electrically connected with the anisotropic conductive film 50 will be described, but the anisotropic conductive paste may be used instead of the anisotropic conductive film 50.

The circuit film 20 illustrated in FIG. 7 is formed by printing the design layer 24 on the insulating film 21, printing the electrical circuit 22 on the design layer 24, and further printing the adhesive layer 25. The adhesive layer is printed excluding the crimped portion of the FPC 40 by printing method, such as screen printing.

In the first step, as illustrated in FIG. 8, the circuit film 20 with the FPC crimped is automatically set to the first mold 101 with, for example, a robot arm 190. After the circuit film 20 is set to the first mold 101, the robot arm 190 retracts from between the first mold 101 and the second mold 102.

In the second step, from the state illustrated in FIG. 8, for example, an air cylinder 180 advances the storage pin 103 toward the first mold 101. However, an actuator for moving the storage pin 103 is not limited to the air cylinder 180. Here, in the process of the second mold 102 approaching the first mold 101, the FPC 40 enters into the storage space SS due to control of the FPC 40 in a flexure state and own weight. Note that auxiliary means (not illustrated) may be provided to guide the FPC 40 to the storage space SS.

When the first mold 101 and the second mold 102 are clamped, the storage pin 103 retreats toward the second mold 102 while a bottom surface 103a abuts on the FPC 40. For example, the air cylinder 180 is configured to retreat the storage pin 103 by a predetermined amount synchronously with the advancement of the second mold 102. In the state in which clamping of the first mold 101 and the second mold 102 is completed, the air cylinder 180 presses the storage pin 103 against the FPC 40. In other words, the storage pin 103 presses the FPC 40 against the circuit film 20. The storage pin 103 has an abutment surface 103b standing from the bottom surface 103a. The abutment surface 103b is disposed such that the abutment surface 103b is fitted to the FPC 40 during injection of the molten resin 200, and the storage pin 103 can prevent the FPC 40 from falling with the molten resin 200.

The storage pin 103 has a width substantially the same as a width of the FPC 40, for example. The portion exposed from the molded resin of the FPC 40 is stored in the storage space SS surrounded by the storage pin 103 and the second mold 102, and the storage pin 103 is retreated, thus ensuring separating the cavity Cv from the storage space SS. Here, the case in which the storage pin 103 and the FPC 40 have substantially the same width will be described. However, for example, the width of the storage pin 103 may be larger than the width of the FPC 40, and a slit-shaped groove having a width substantially the same width of the FPC 40 may be formed in the storage pin 103. The storage pin 103 is not limited to have the width same as the width of the FPC 40.

In a third step, the molten resin 200 is injected into the cavity Cv formed by clamping. In the method for manufacturing the operation panel 10 according to the first embodiment, injection molding is performed by two-point hot runner valve gates (a first gate 121 and a second gate 122). Here, the case of the two-point gates will be described, but the injection molding may be performed by multipoint gates of three or more point gates. In the second mold 102 illustrated in FIG. 12, a heater 130 heats a runner. In this way, a hot runner method is employed in the second mold 102.

Figure 10:
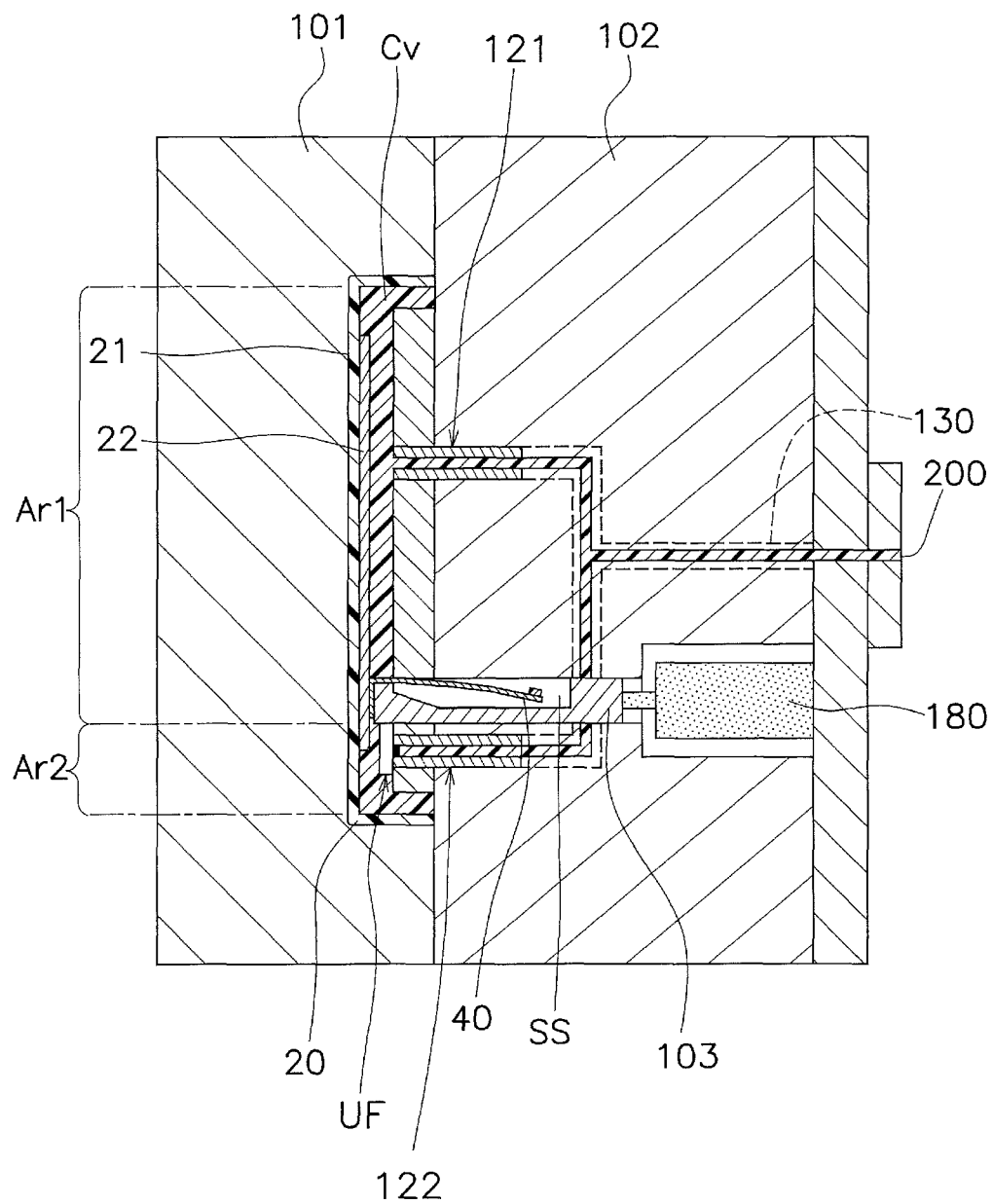
FIG. 10 is a schematic cross-sectional view for describing injection of a molten resin from a first gate in the first embodiment.
Figure 11:
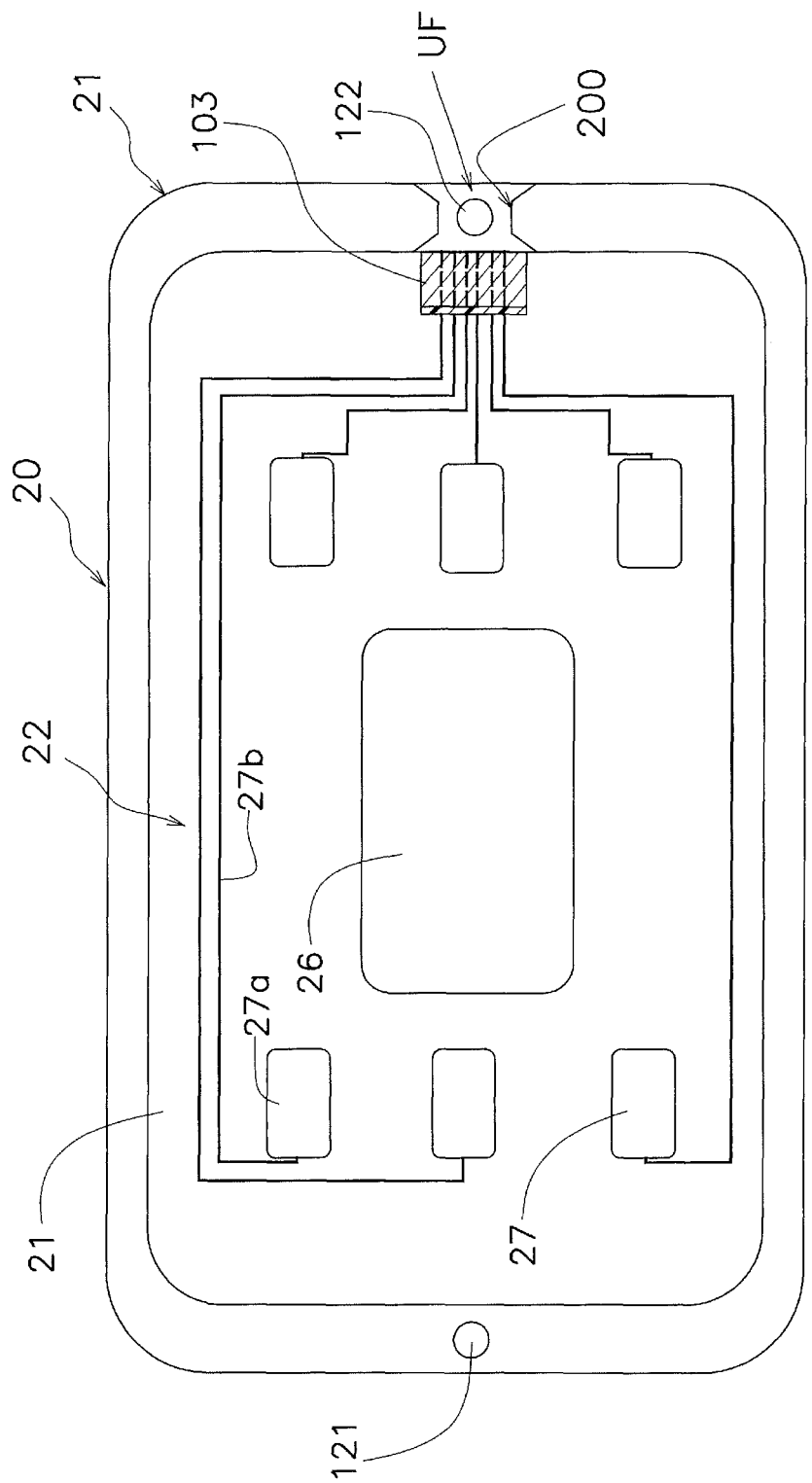
FIG. 11 is a schematic plan view illustrating the molten resin, the circuit film, and the FPC in FIG. 10.

First, the molten resin 200 is injected from the first gate 121 with the second gate 122 closed. FIG. 10 illustrates a filling state of the molten resin 200 injected from the first gate 121 in a cross-sectional surface taken along a straight line passing through the first gate 121 and the second gate 122. FIG. 11 illustrates the filling state of the molten resin 200 injected from the first gate 121 on the plane of the circuit film 20. The molten resin 200 that has flowed into the cavity Cv from the first gate 121 is filled in a first area Ar1. However, an unfilled point UF that is not filled occurs in a portion of a second area Ar2 far from the first gate 121. In particular, when viewed from the first gate 121, the unfilled portion UF occurs behind the storage pin 103. The second gate 122 is provided in the second mold 102 such that the second gate 122 is disposed in the unfilled portion UF. The molten resin 200 flowing from the first gate 121 flows in a direction of pressing the FPC 40 against the storage pin 103. At this time, the abutment surface 103b of the storage pin 103 is fitted to the FPC 40, and the FPC 40 is supported by the storage pin 103 such that the FPC 40 does not fall by the flow of the molten resin 200.

Figure 12:
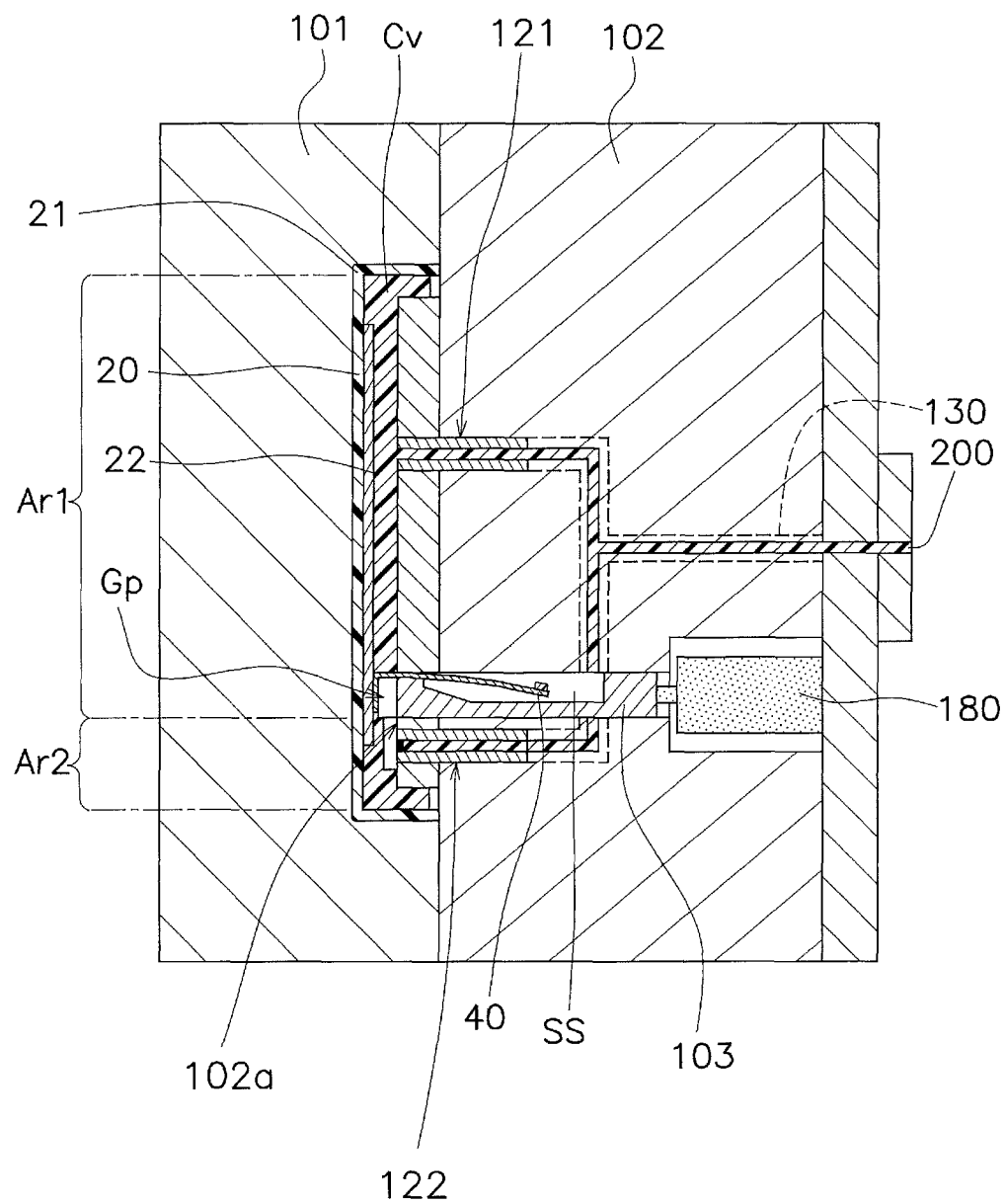
FIG. 12 is a schematic cross-sectional view illustrating a state of the molten resin after a retreat of a storage pin in the first embodiment.
Figure 13:
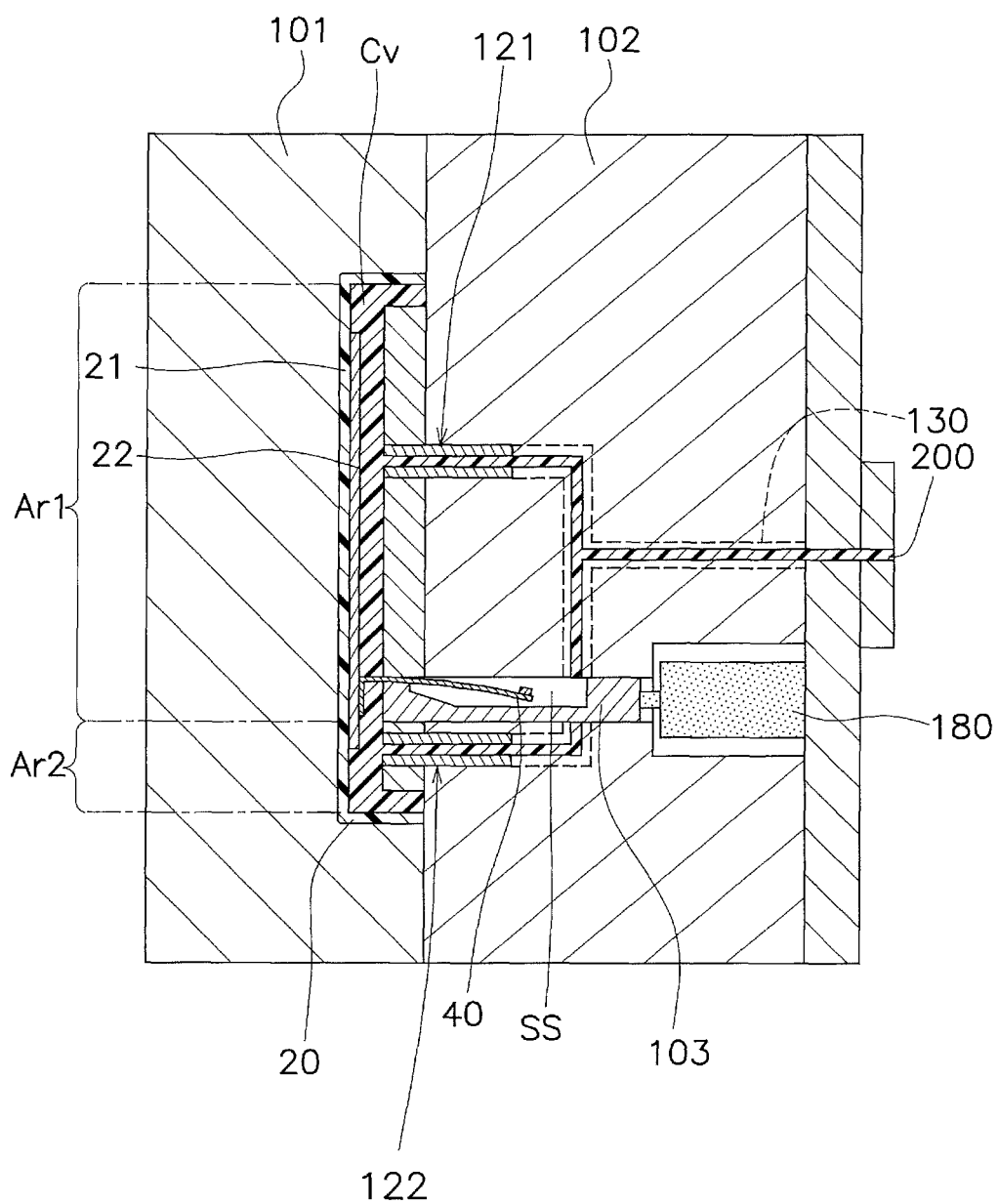
FIG. 13 is a schematic cross-sectional view for describing injection of the molten resin from a second gate in the first embodiment.
Figure 14:
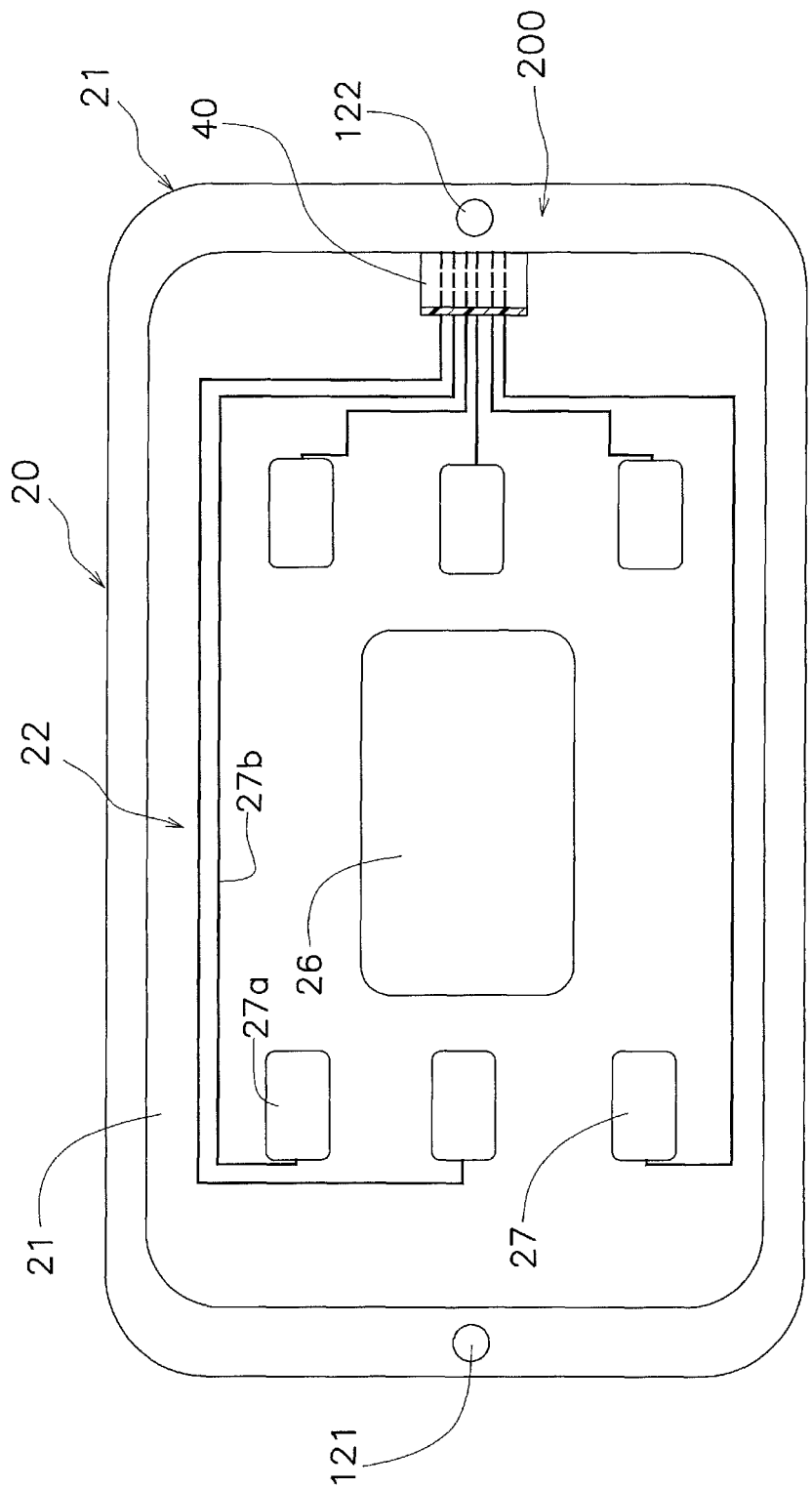
FIG. 14 is a schematic plan view illustrating the molten resin, the circuit film, and the FPC in FIG. 13.

From the state illustrated in FIG. 10, the air cylinder 180 retreats the storage pin 103. As illustrated in FIG. 12, the storage pin 103 is returned to a core surface 102a of the second mold 102. As a result of retreat of the storage pin 103, a gap Gp in which the molten resin 200 is not filled is further generated. A valve of the second gate 122 is opened, the molten resin 200 is injected from the second gate 122, and the molten resin 200 is mainly filled in the unfilled portion UF of the second area Ar2 and the gap Gp. Although the gap Gp occurs, the injected resin filled from the first gate 121 is present behind the FPC 40. The injected resin behind the FPC 40 supports the FPC 40 in the gap Gp. Thus, even when the valve of the second gate 122 opens and the molten resin 200 is filled in the void Gp, the FPC 40 will not be washed out. Thus, conductivity is maintained at the crimped portion of the circuit film 20 and the FPC 40 and the main body portion of the FPC 40 is sandwiched with the injected resin. As a result, as illustrated in FIG. 13 and FIG. 14, the molten resin 200 is filled and the state in which the circuit film 20 and the FPC 40 are connected is maintained, and the FPC 40 passes through the molded body 30.

(3-3) Incorporation of Molded Article into Electrical Product

The operation panel 10 as the molded article thus manufactured is incorporated into the chassis 2 of the breadmaker 1 as the electrical product. The controller 81, the liquid crystal display device 82, and the other electrical device 83 are installed in the chassis 2. The abutment of the external connection terminals 42 of the FPC 40 with an electrode of the controller 81 allows the operation panel 10 to electrically connect with the controller 81, the liquid crystal display device 82, and the other electrical device 83.

Second Embodiment

In the first embodiment, the case in which the molten resin 200 is injected into the cavity Cv formed of the first mold 101 and the second mold 102 using the two-point gates has been described. In the second embodiment, a method for manufacturing molded article for injecting the molten resin 200 into the cavity Cv using one-point gate will be described. Note that in the second embodiment, same reference numerals are given to components same as those of the first embodiment.

(4) Method for Manufacturing Molded Article (4-1) Overview of Method for Manufacturing Molded Article The overview of the method for manufacturing molded article of the second embodiment is the same as the method for manufacturing molded article of the first embodiment, and thus description thereof is omitted.

(4-2) Details of Method for Manufacturing Operation Panel 10

The method for manufacturing the operation panel 10 according to the second embodiment will be described in detail.

In the second embodiment, similar to the first embodiment, the crimped circuit film 20 illustrated in FIG. 7 is prepared.

In the first step, the crimped circuit film 20 is automatically set to the first mold 101 as described in the first embodiment.

Figure 15:
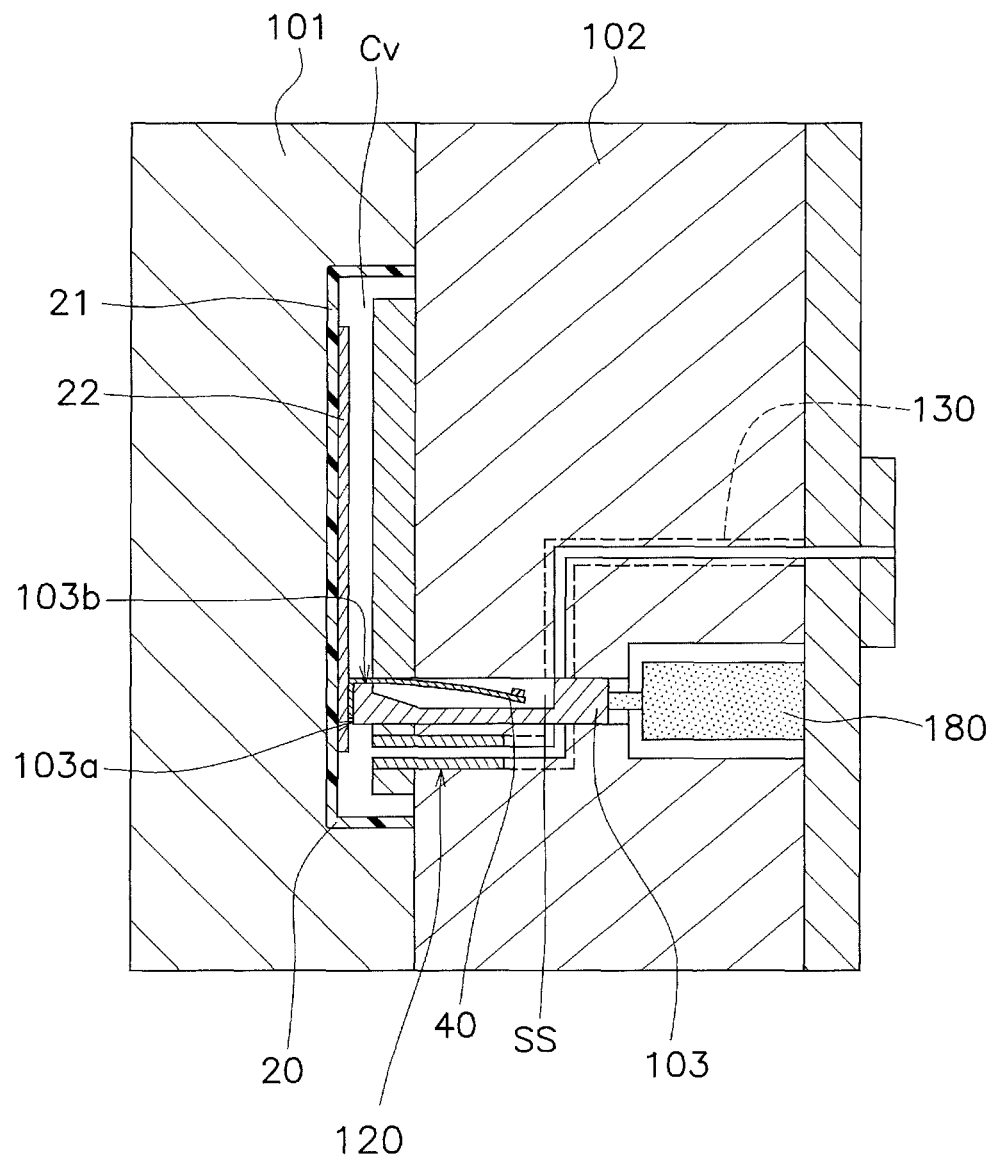
FIG. 15 is a schematic cross-sectional view illustrating clamped first mold and second mold in a second embodiment.

Similar to the first embodiment, in the second step, the FPC 40 is put into the storage space SS in the second embodiment as well. As illustrated in FIG. 15, in the state in which clamping of the first mold 101 and the second mold 102 is completed, the air cylinder 180 presses the storage pin 103 against the FPC 40.

In a third step, the molten resin 200 is injected into the cavity Cv formed by clamping. In the method for manufacturing the operation panel 10 according to the first embodiment, injection molding is performed by one-point gate (a gate 120). The gate 120 is provided in the vicinity of the storage pin 103. Here, the vicinity of the storage pin 103 is defined in a range in which a state of the resin around the storage pin 103 is melted is maintained when the molten resin 200 is injected from the gate 120 and the cavity Cv is filled with the resin.

Figure 16:
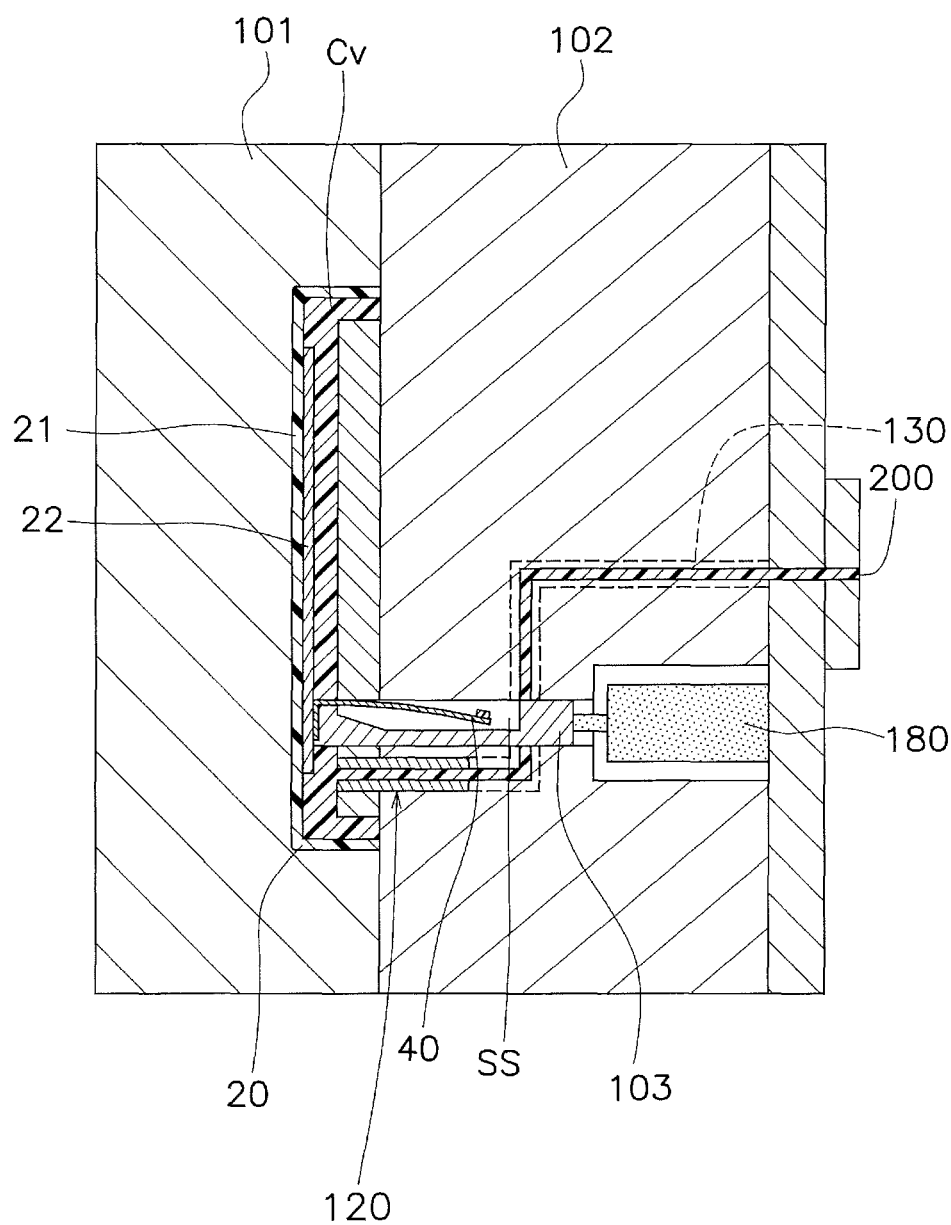
FIG. 16 is a schematic cross-sectional view illustrating the first mold and the second mold into which the molten resin has been injected in the second embodiment.

The molten resin 200 is injected from the gate 120. FIG. 16 illustrates the filling state of the molten resin 200 injected from the gate 120 in a cross-sectional surface taken along a straight line passing through the gate 120. The molten resin 200 that has flowed into the cavity Cv from the gate 120 goes around behind the storage pin 103 and flows in a direction of pressing the FPC against the storage pin 103. At this time, the abutment surface 103b of the storage pin 103 is fitted to the FPC 40, and the FPC 40 is supported by the storage pin 103 such that the FPC 40 does not fall by the flow of the molten resin 200.

Figure 17:
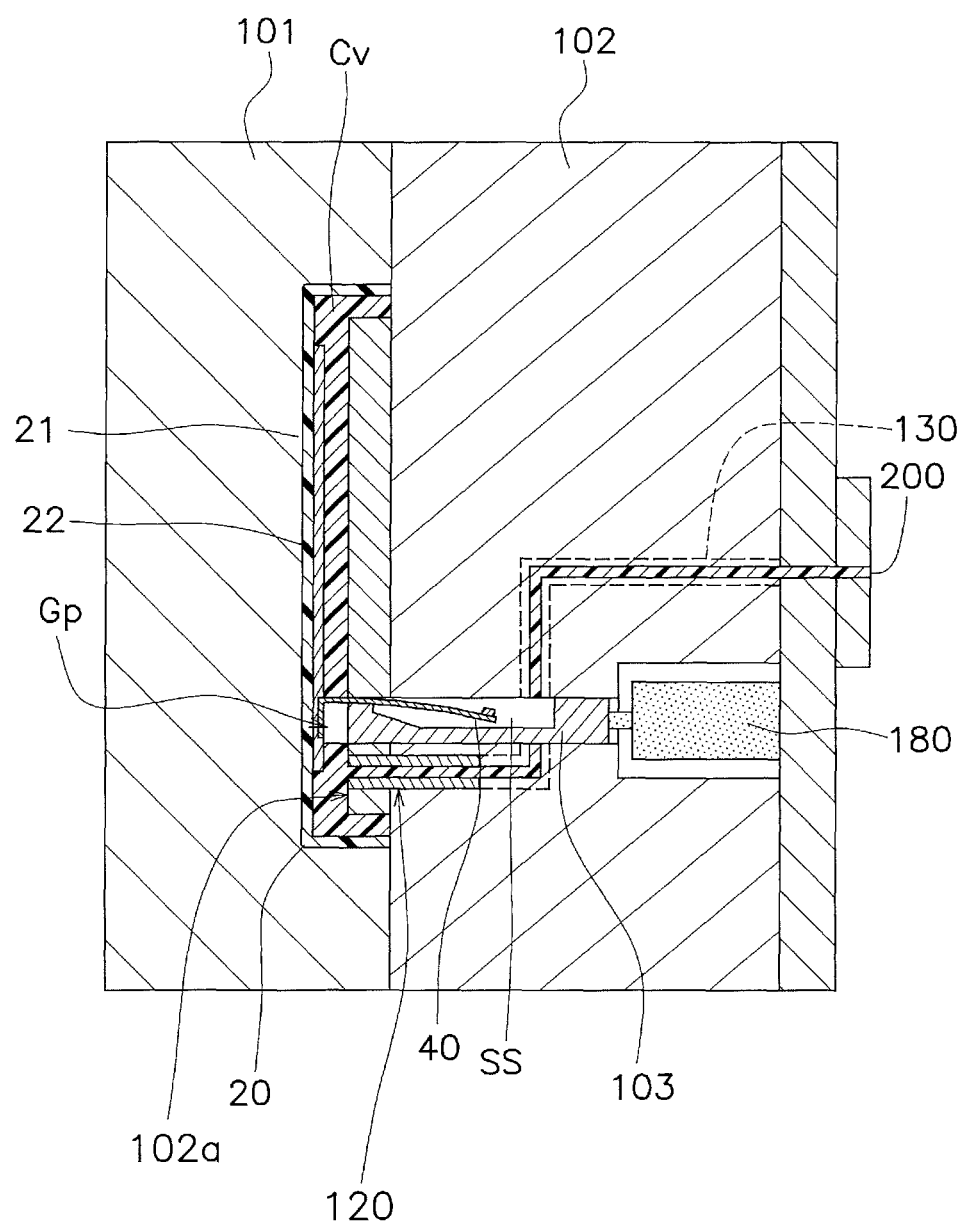
FIG. 17 is a schematic cross-sectional view illustrating a state of the molten resin after the retreat of the storage pin in the second embodiment.

From the state illustrated in FIG. 16, the air cylinder 180 retreats the storage pin 103. As illustrated in FIG. 17, the storage pin 103 is returned to the core surface 102a of the second mold 102. As a result of retreat of the storage pin 103, the gap Gp in which the molten resin 200 is not filled is generated.

Figure 18:
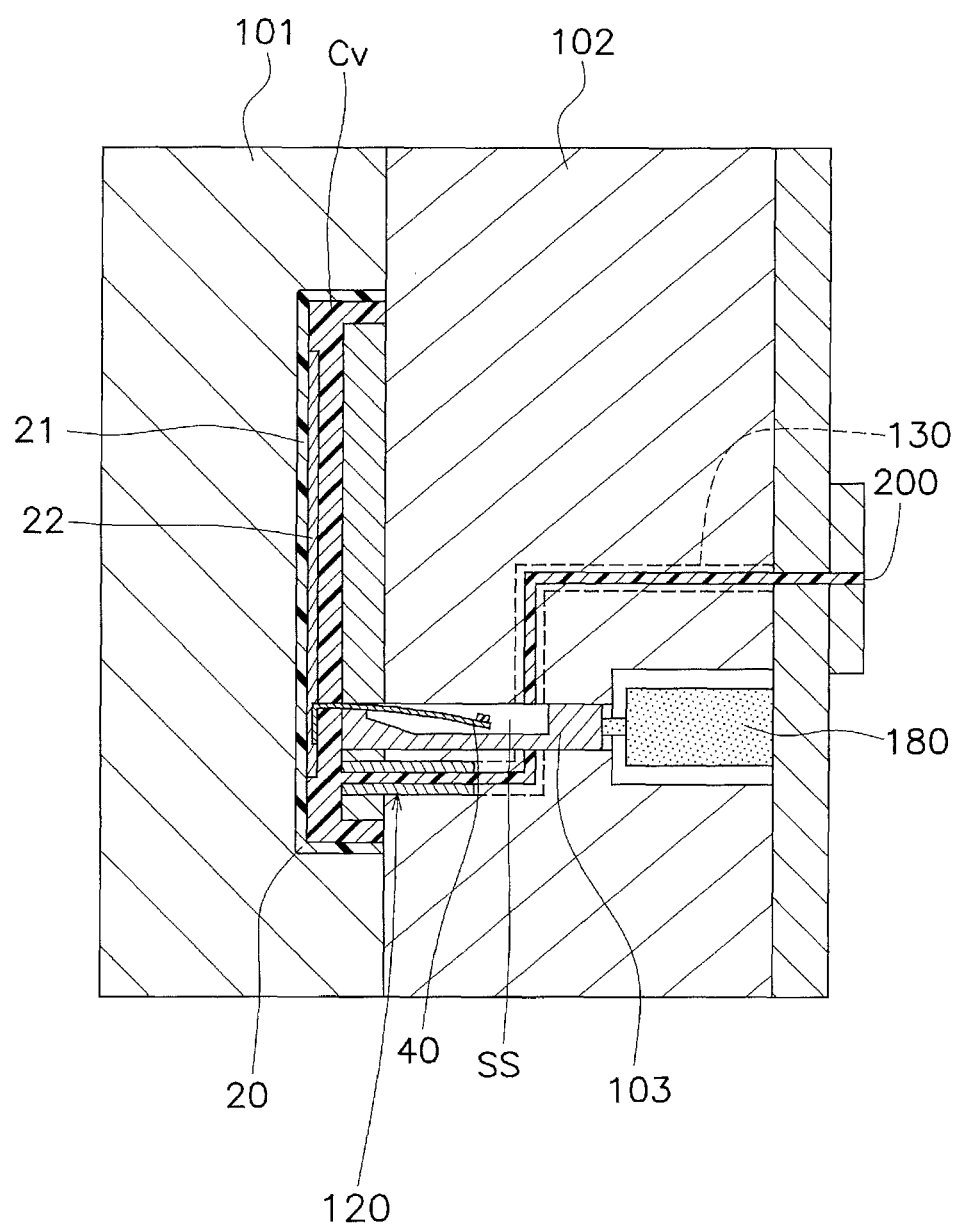
FIG. 18 is a schematic cross-sectional view for describing injection of the molten resin after the retreat of the storage pin in the second embodiment.

As illustrated in FIG. 18, the molten resin 200 is injected from the gate 120, and the molten resin 200 is filled in the gap Gp. As a result, as illustrated in FIG. 18, the molten resin 200 is further filled in a portion where the circuit film 20 overlaps with the FPC 40.

Third Embodiment

In the first embodiment and the second embodiment, the case where the external connection terminal 42 of the FPC 40 protrudes from the other main surface 32 of the molded body 30 has been described. However, as described in the third embodiment, the external connection terminal 42 may be exposed as a portion of the other main surface 32 of the molded body 30. Note that in the third embodiment, same reference numerals are given to components same as those of the first embodiment or the second embodiment.

(5) Overview of Operation Panel 10

Figure 19:
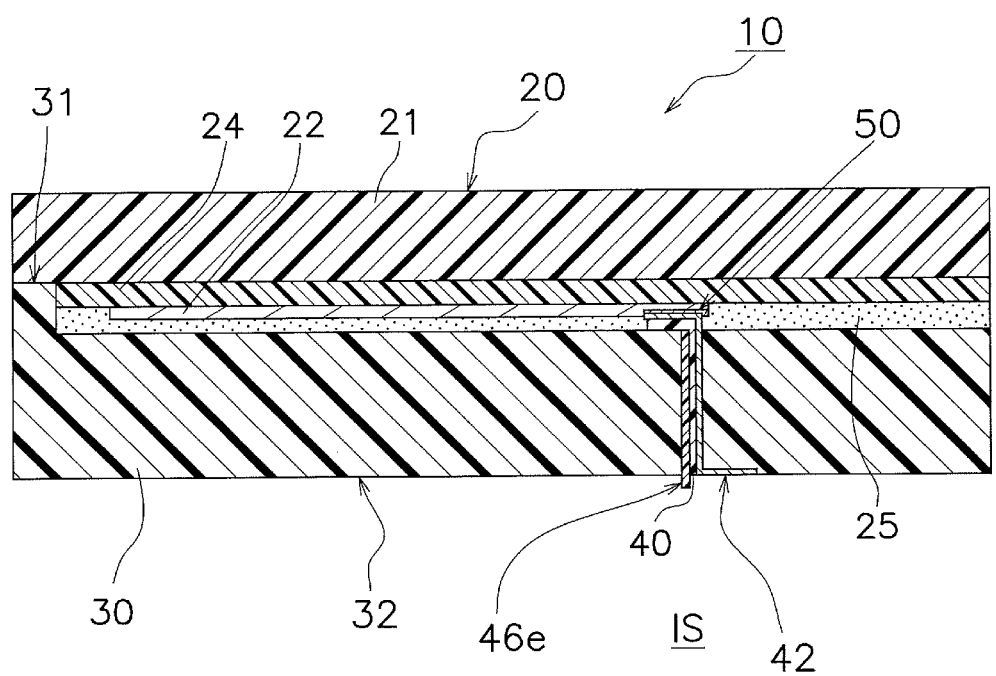
FIG. 19 is a schematic partial cross-sectional view illustrating an example of a molded article according to a third embodiment.

The operation panel 10 of the third embodiment has a cross-sectional structure as schematically illustrated in FIG. 19, and includes the circuit film 20, the molded body 30, and the FPC 40. The circuit film 20 is located on the one main surface 31 of the molded body 30, and is integrally molded with the molded body 30.

The FPC 40 passes through the inside of the molded body 30 and extends so as to reach the other main surface 32 of the molded body 30. While the FPC 40 illustrated in FIG. 19 passes through the molded body 30 and reaches the other main surface 32, but the external connection terminal 42 of the FPC 40 does not protrude from the other main surface 32 to the interior space IS. The external connection terminal 42 is exposed to the internal space IS, but substantially is a portion of the other main surface 32 of the molded body 30. The external connection terminal 42 being substantially a portion of the other main surface 32 of the molded body 30 means that the external connection terminal 42 is flush with the peripheral other main surface 32 or protrudes or depressed with respect to the other main surface 32, and the FPC around the external connection terminal 42 is fixed with the molded body 30.

Figure 20:
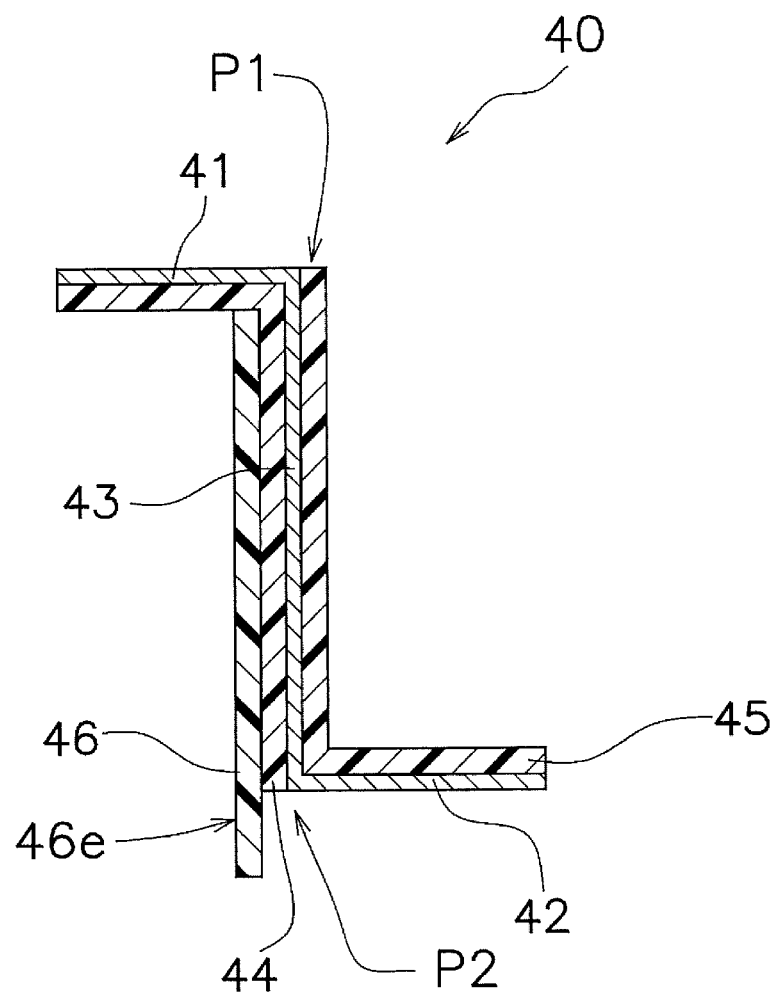
FIG. 20 is a schematic enlarged cross-sectional view illustrating an example of the FPC after pressing in the third embodiment.

The internal connection terminal 41 illustrated in FIG. 20 is electrically connected to the electrical circuit 22 of the circuit film 20 with the anisotropic conductive film 50. The flexible wiring line 43 passes through the inside of the molded body 30 and extends so as to reach the other main surface 32.

(6) Method for Manufacturing Molded Article (6-1) Overview of Method for Manufacturing Molded Article In the method for manufacturing molded article of the third embodiment, in the first step, as illustrated in FIG. 20, the FPC 40 is bent by pressing so as to have a shape after molding. During pressing, the FPC 40 may be heated. The circuit film 20 to which the FPC 40 thus bent is crimped is set to the first mold 101.

Figure 21:
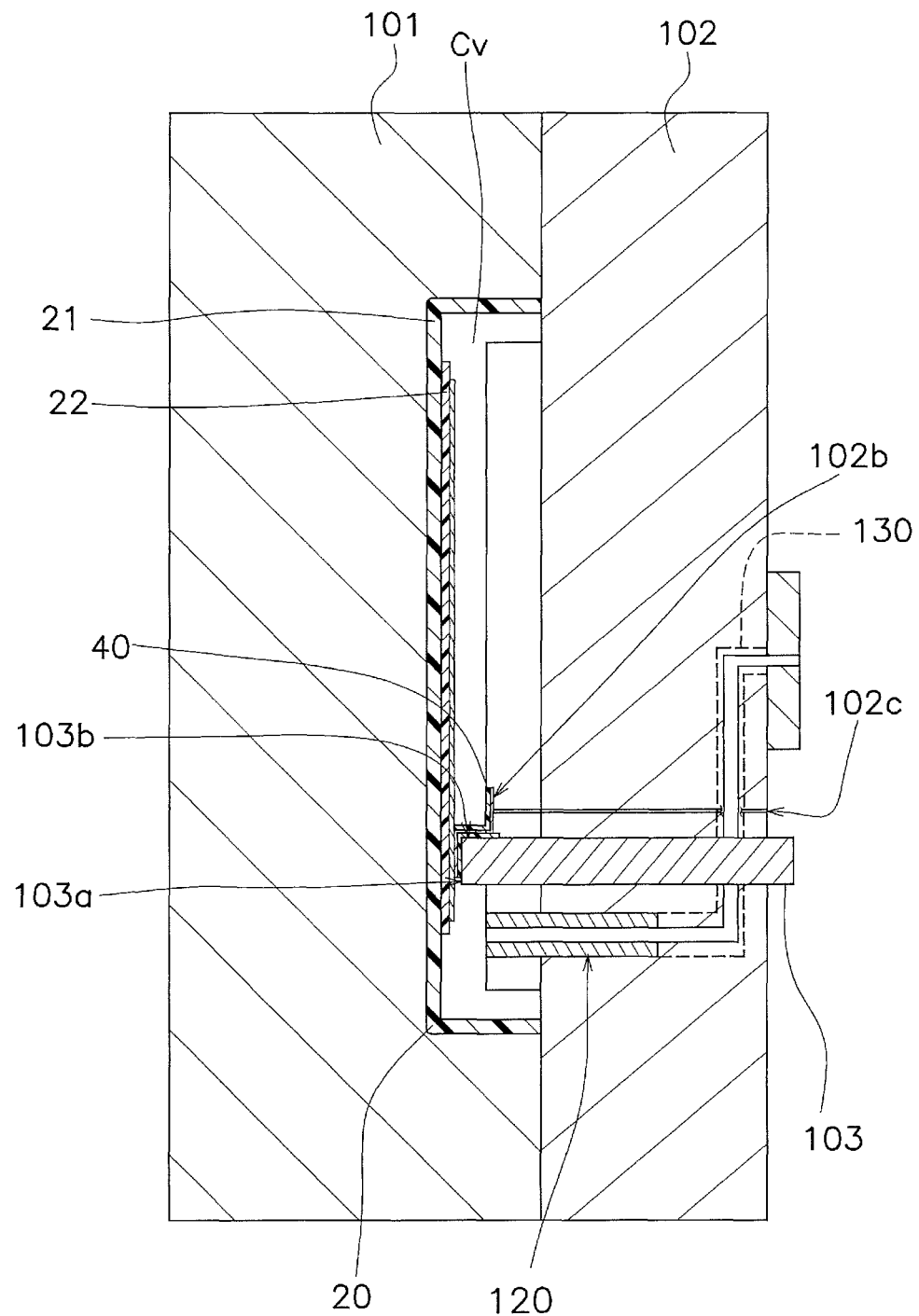
FIG. 21 is a schematic cross-sectional view illustrating the clamped first mold and second mold in the third embodiment.

In the second step, as illustrated in FIG. 21, the first mold 101 and the second mold 102 are clamped to form the cavity Cv. The FPC 40 is supported by the storage pin 103 so as to standing from the circuit film 20 in the cavity Cv.

Figure 22:
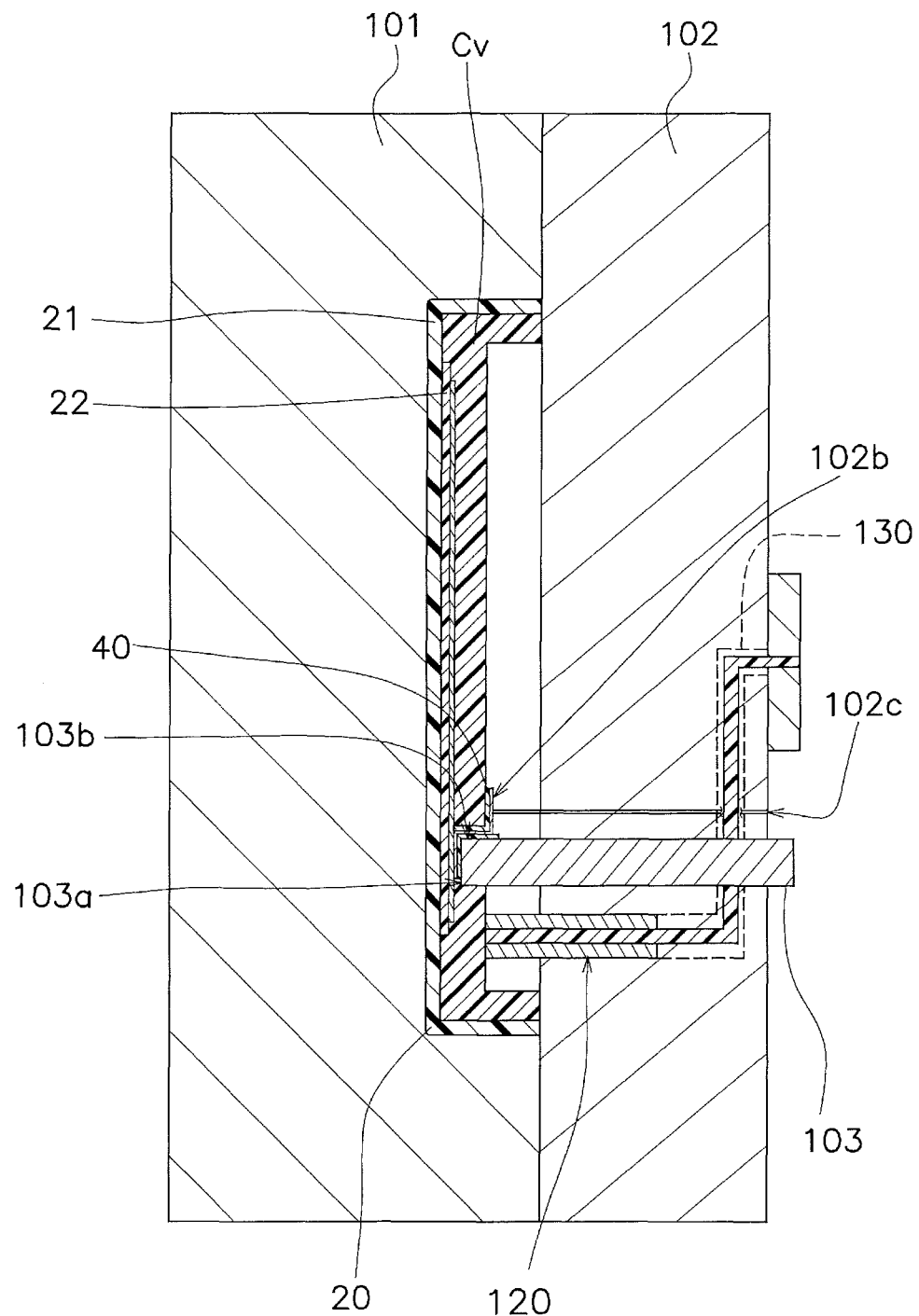
FIG. 22 is a schematic cross-sectional view illustrating the first mold and the second mold into which the molten resin has been injected in the third embodiment.
Figure 23:
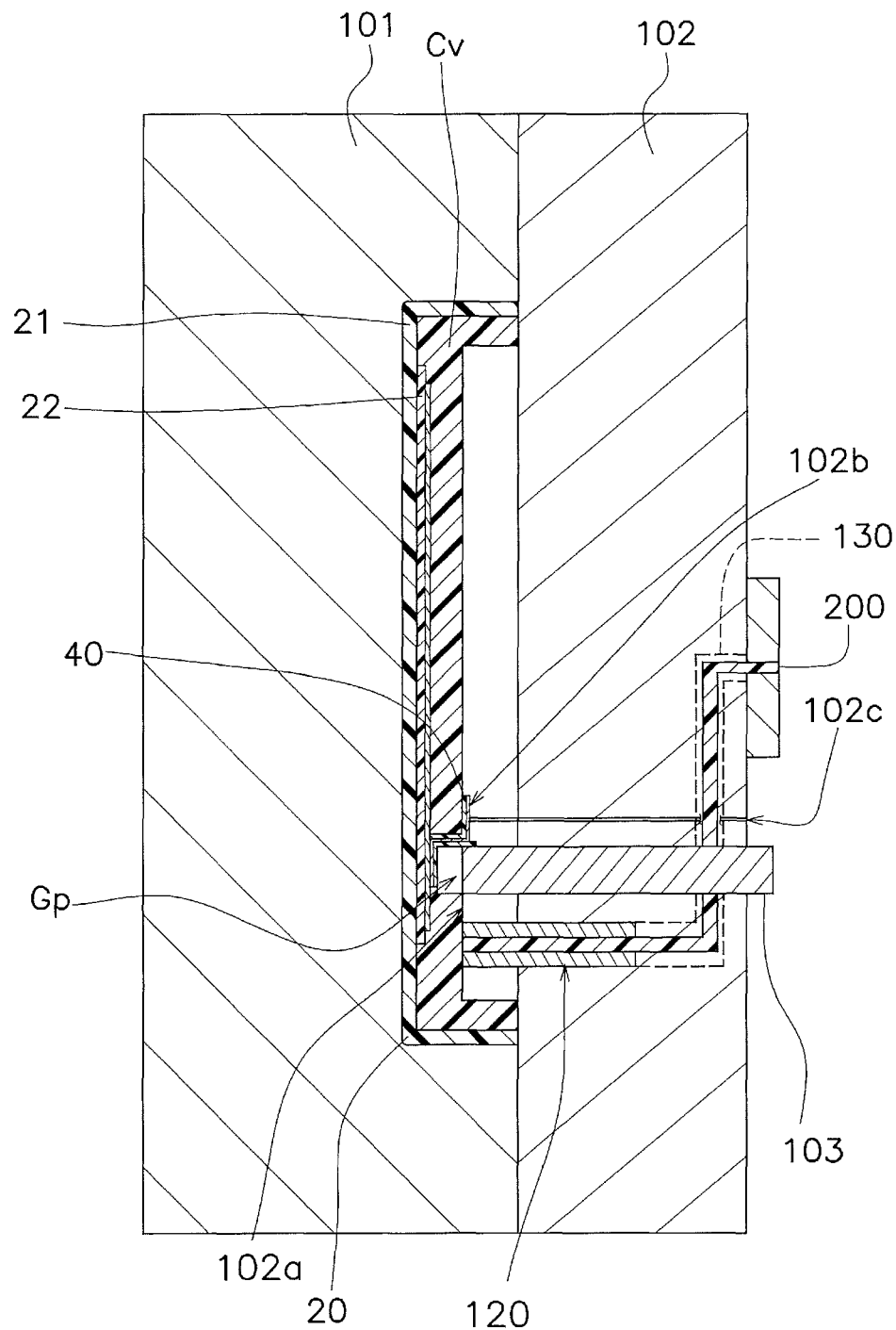
FIG. 23 is a schematic cross-sectional view illustrating a state of the molten resin after the retreat of the storage pin in the third embodiment.
Figure 24:
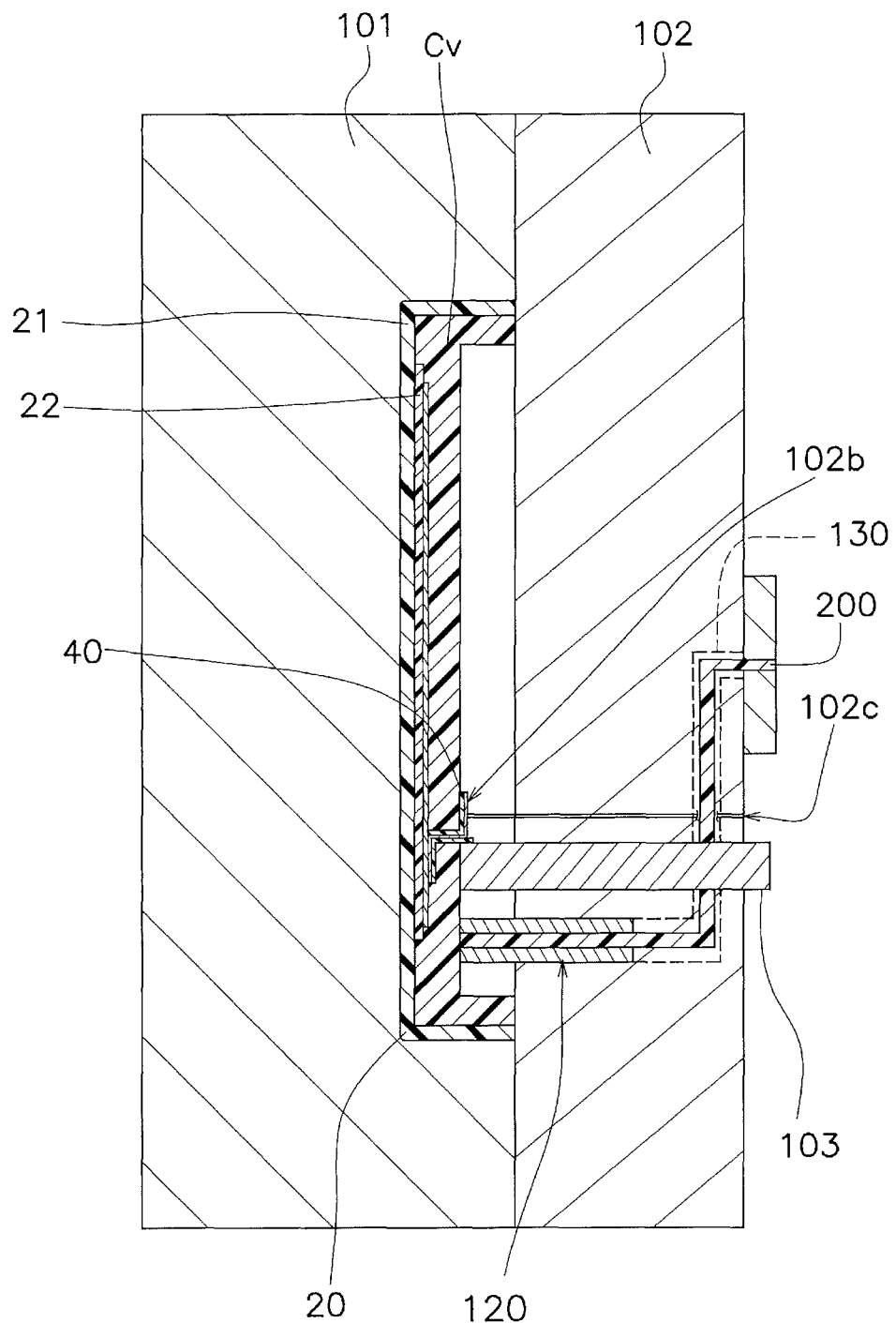
FIG. 24 is a schematic cross-sectional view for describing injection of the molten resin after the retreat of the storage pin in the third embodiment.

In a third step, as illustrated in FIG. 22, FIG. 23, and FIG. 24, the molten resin 200 is injected into the cavity Cv to form the molded body 30 integrally molded with the circuit film 20. When the molded body 30 is formed, in a state of the storage pin 103 retreating (see FIG. 23), the molten resin 200 is further injected into the gap Gp generated by the retreat of the storage pin 103 (see FIG. 24). As a result, the FPC 40 passes through the inside of the molded body 30 and extends so as to reach the other main surface 32 facing the one main surface 31 of the molded body 30 in which the circuit film 20 is disposed and the external connection terminal 42 of the FPC 40 is exposed as a portion of the other main surface 32.

(6-2) Details of Method for Manufacturing Operation Panel 10

The method for manufacturing the operation panel 10 according to the third embodiment will be described.

As illustrated in FIG. 20, the FPC 40 of the third embodiment is bent in the reverse directions at two locations, a first position P1 of the wiring line 43 close to the internal connection terminal 41 and a second location P2 of the wiring line 43 close to the external connection terminal 42 by pressing. The shape of the FPC 40 after pressing the FPC 40 is close to the shape of the FPC taken in the molded body 30 after injection molding. The reinforcing film 46 is provided on a body portion (a portion where the wiring line 43 extends from the one main surface 31 toward the other main surface 32) of the FPC 40 from the one main surface 31 to the other main surface 32 of the molded body 30. A distal end portion 46e of the reinforcing film 46 protrudes from the other main surface 32. The distal end portion 46e of the reinforcing film 46 is fitted into a recessed portion 102b of the core surface 102a. The reinforcing film 46 is also bent by pressing. The first portion P1 and the second portion P2 of the FPC 40 retain flexibility. This facilitates a contact of the FPC 40 with the electrical circuit 22 due to the flexibility of the first position P1. Furthermore, the FPC can be easily set to the second mold 102 due to the flexibility of the second location P2.

The pressed FPC 40 is crimped to the circuit film 20 with the anisotropic conductive film 50.

In the third embodiment, similar to the first embodiment, the crimped circuit film 20 illustrated in FIG. 7 is prepared. The FPC 40 is crimped on the circuit film 20.

In the first step, the crimped circuit film 20 is automatically set to the first mold 101 as described in the first embodiment.

In the second step, as illustrated in FIG. 21, in the state in which clamping of the first mold 101 and the second mold 102 is completed, the air cylinder (not illustrated) presses the storage pin 103 against the FPC 40.

When the first mold 101 and the second mold 102 are clamped, the storage pin 103 retreats toward the second mold 102 while the bottom surface 103a abuts on the FPC 40. In the state in which clamping of the first mold 101 and the second mold 102 is completed, the air cylinder 180 presses the storage pin 103 against the FPC 40. In other words, the storage pin 103 presses the FPC against the circuit film 20. The storage pin 103 has the abutment surface 103b standing from the bottom surface 103a. The abutment surface 103b is disposed such that the abutment surface 103b is fitted to the FPC 40 during injection of the molten resin 200, and the storage pin 103 can prevent the FPC from falling with the molten resin 200. To assist the support of the FPC 40, a suction hole 102c is provided in the core surface 102a of the second mold 102. The suction hole 102c sucks the surface of the external connection terminal 42 of the FPC 40. The recessed portion 102b is formed in the core surface 102a of the second mold 102, and the external connection terminal 42 is configured to fit into the recessed portion 102b. However, the periphery of the core surface 102a on which the external connection terminal 42 abuts may have a flat surface without forming the recessed portion 102b, or a portion inside the core surface 102a on which the external connection terminal 42 abuts may be protruded.

In the third step, the molten resin 200 is injected into the cavity Cv formed by clamping. In the method for manufacturing the operation panel 10 according to the first embodiment, injection molding is performed by one-point gate (the gate 120). The gate 120 is provided in the vicinity of the storage pin 103.

The molten resin 200 is injected from the gate 120. FIG. 22 illustrates the filling state of the molten resin 200 injected from the gate 120 in a cross-sectional surface taken along a straight line passing through the gate 120. The molten resin 200 that has flowed into the cavity Cv from the gate 120 goes around the storage pin 103 and flows in a direction of pressing the FPC 40 against the storage pin 103. At this time, the abutment surface 103b of the storage pin 103 is fitted to the FPC 40, and the FPC 40 is supported by the storage pin 103 such that the FPC 40 does not fall by the flow of the molten resin 200.

From the state illustrated in FIG. 22, the air cylinder retreats the storage pin 103. As illustrated in FIG. 23, the storage pin 103 is returned to the core surface 102a of the second mold 102. As a result of retreat of the storage pin 103, the gap Gp in which the molten resin 200 is not filled is generated.

As illustrated in FIG. 24, before the molten resin 200 loses fluidity, the molten resin 200 is injected from the gate 120, and the molten resin 200 is filled in the gap Gp. As a result, as illustrated in FIG. 24, the molten resin 200 is further filled in a portion where the circuit film 20 overlaps with the FPC 40.

Fourth Embodiment

The operation panels 10 as the molded articles according to the first embodiment to the third embodiment are electrically connected to the electrical devices 3 in the chassis 2 of the breadmakers 1 as the electrical products with the flexible printed wiring boards 40. The circuit film 20 can include an external wiring line portion substituting for the function of the FPC 40. Note that in the fourth embodiment, same reference numerals are given to components same as those of the first embodiment, the second embodiment, or the third embodiment.

(7) Overview of Operation Panel 10

Figure 25:
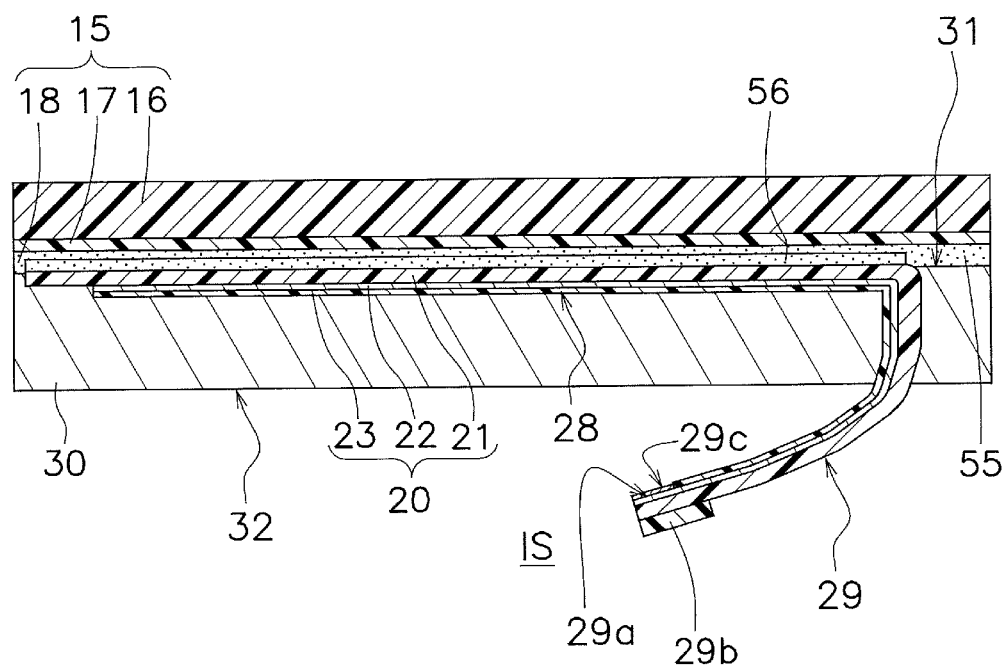
FIG. 25 is a schematic partial cross-sectional view illustrating an example of the molded article according to a fourth embodiment.
Figure 26:
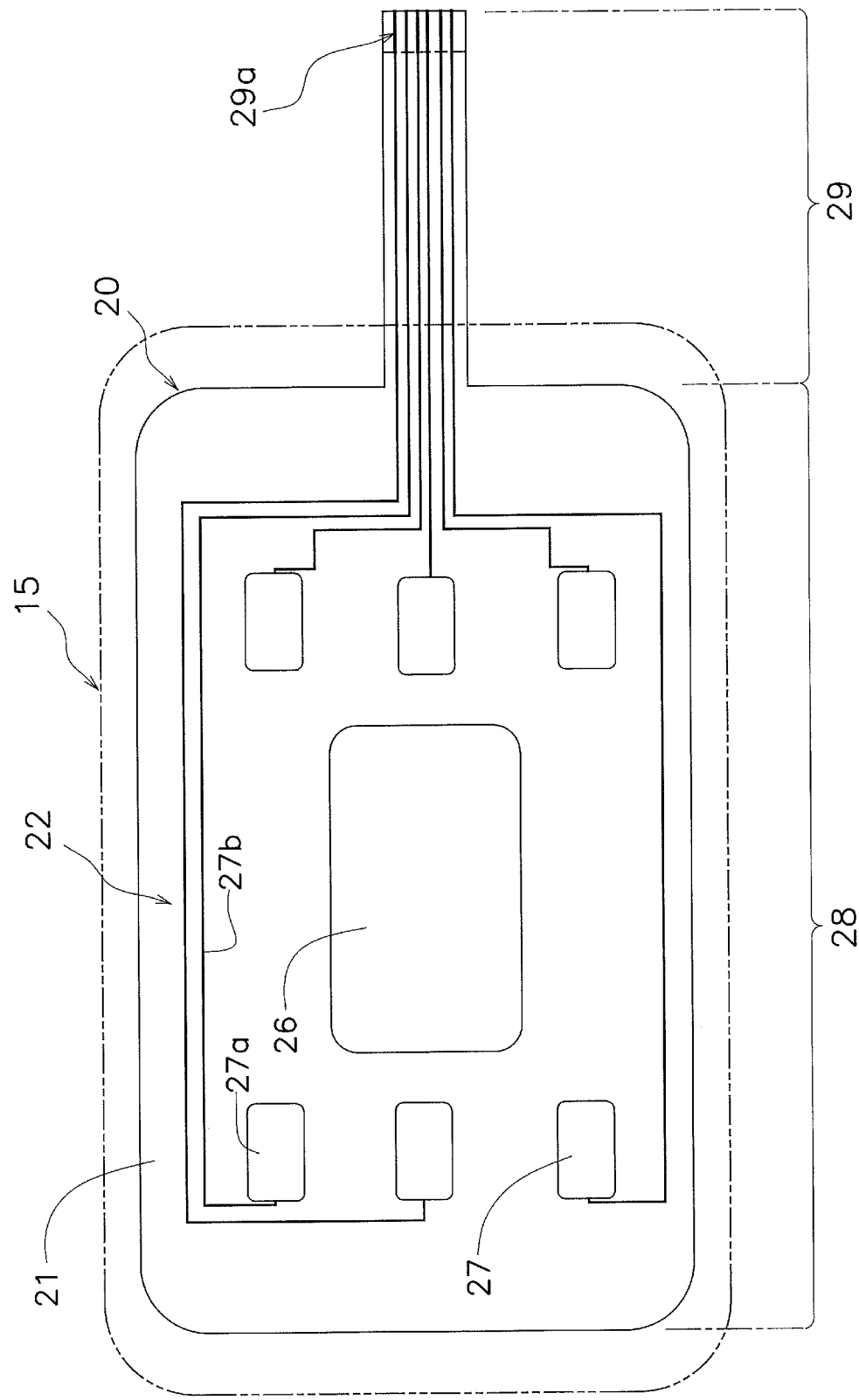
FIG. 26 is a schematic cross-sectional view illustrating an example of the circuit film and the decorative film before crimping.
Figure 27:
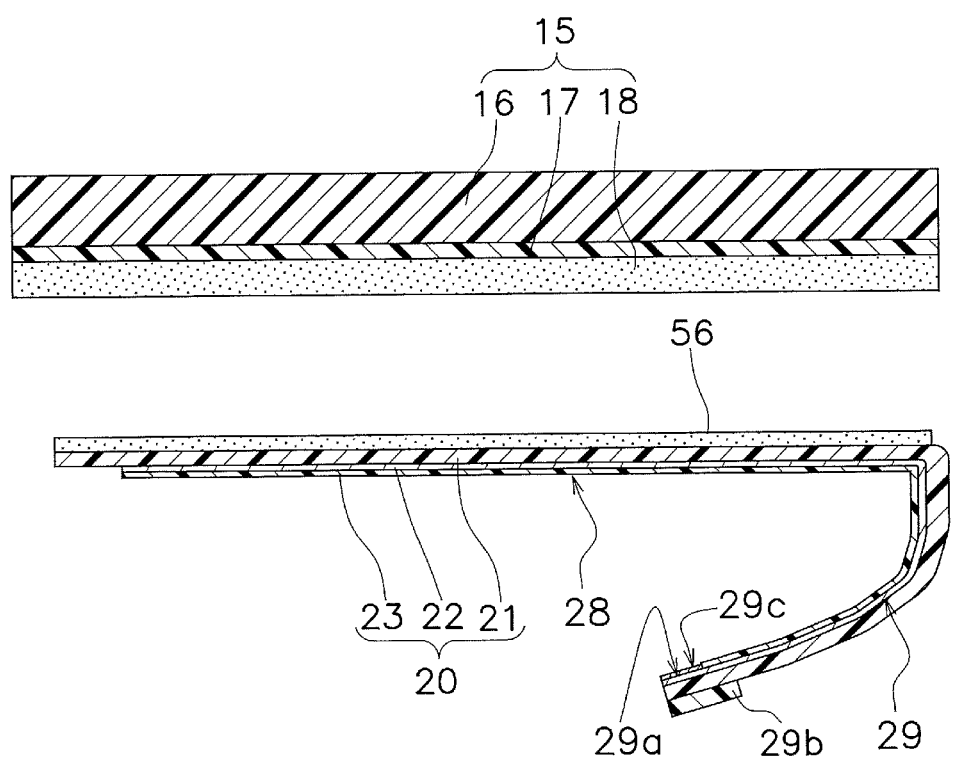
FIG. 27 is a plan view for describing the circuit film illustrated in FIG. 26.

The operation panel 10 of the fourth embodiment as the molded article has a schematic cross-sectional shape illustrated in FIG. 25, and includes the decorative film 15, the circuit film 20, and the molded body 30. In the operation panels 10 of the first embodiment to the third embodiment, the design layers 24 are formed in the circuit films 20, but in the fourth embodiment, the decorative film 15 is provided separately from the circuit film 20. A design layer 17 is formed in the decorative film 15. Note that, in the fourth embodiment, the case in which the operation panel 10 includes the decorative film 15 and the circuit film 20 will be described. However, the operation panel of the fourth embodiment may form the design layer 24 in the circuit film 20 similarly to the first embodiment to the third embodiment and does not include the decorative film 15.

(7-1) Circuit Film 20

The circuit film 20 includes the insulating film 21 and the electrical circuit 22. The molded body 30 has the one main surface 31 and the other main surface 32 facing each other. As illustrated in FIG. 25, the circuit film 20 of the operation panel 10 is located on the one main surface 31 of the molded body 30, and is integrally molded with the molded body 30. The decorative film 15 of the operation panel 10 is located on the one main surface 31 of the molded body 30, and is integrally molded with the molded body 30. The decorative film 15 covers the entire circuit film 20 and decorates the appearance of the operation panel 10. However, the decorative film 15 need not be provided to cover the entire circuit film 20. For example, in the electrical product to which the present invention is applied, the decorative film 15 may cover a portion of the circuit film 20. For example, on the design layer 17, a design indicative of a function of the membrane switch 27 like "ON/OFF," a design like a frame line indicating a range of the touch sensor 26, or a design like a background color that harmonizes with a color of the chassis 2 is provided. The circuit film 20 includes the electrical circuit 22 in contact with the design layer 17. To prevent formation of an unnecessary electrical path of flowing a current from the circuit film 20 to the electrical circuit 22 through the decorative film 15, the decorative film 15 is preferably insulated on the side facing the circuit film 20.

(7-2) Decorative Film 15

The decorative film 15 can be constituted by, for example, a base film 16, the design layer 17, and an adhesive layer 18. The decorative film 15 includes, for example, a decoration film. As the base film 16, for example, a film similar to a film made of resin constituting the circuit film 20 can be used. In the decorative film 15 of FIG. 25, the base film 16 is disposed outside, and the design layer 17 is disposed inside. In such a configuration, to make the design layer 17 visible from outside, a transparent or translucent material is used for the base film 16. Note that a top coat layer for enhancing durability may be formed on the outside of the base film 16.

The design layer 17 is a layer to express a design, such as a pattern. The design layer 17 is formed by, for example, performing gravure printing or screen printing on the base film 16. The design layer 17 of the decorative film can be configured similarly to the design layer 24 of the first embodiment. Therefore, the detailed description of the design layer 17 will be omitted here. The design layer 17 may be disposed on the outer surface of the decorative film 15. The decorative film 15 may be a film that forms fine irregularities to change a texture on the surface of the design layer 17.

Furthermore, the decorative film 15 need not include the design layer 17, and may be, for example, a plain colored or transparent resin film.

The adhesive layer 18 can be formed, for example, using a material that can be used for the adhesive layer 25.

In the molded body 30 in FIG. 25, the one main surface 31 is located outside the breadmaker 1 as the electrical product, and the other main surface 32 is located inside the breadmaker 1. The inside of the chassis 2 of the breadmaker 1 is the internal space IS of the electrical product.

The circuit film 20 includes the insulating film 21, the electrical circuit 22, and an overcoat layer 23. The overcoat layer 23 is a protective layer for preventing oxidation and sulfurization due to outside air and a scratch of the electrical circuit 22 of the circuit film 20. The overcoat layer 23 ensures an insulation with the outside, and also has adhesiveness with the molded body 30. However, as necessary, an adhesive layer may separately be provided on the overcoat layer 23. The overcoat layer 23 is formed, for example, using an ink made of a material forming a coat that usually cures by ultraviolet light (UV) or heat and has flexibility even after curing by means, such as screen printing. Note that the circuit films 20 of the first embodiment to the third embodiment can include the overcoat layers 23 similarly to the fourth embodiment.

The circuit film 20 according to the fourth embodiment can be divided into a main body portion 28 and an external wiring line portion 29. The main body portion 28 is disposed on the one main surface 31 of the molded body 30. The external wiring line portion 29 has a width narrower than that of the main body portion 28 and is bent in a direction of intersecting with the main body portion 28. The external wiring line portion 29 passes through the inside of the molded body 30 and extends so as to reach the other main surface 32. The external wiring line portion 29 includes an external connection terminal 29a exposed outside from the other main surface 32 of the molded body 30. A terminal protection layer 29c to prevent oxidation and sulfidation due to outside air and improve a scratch resistance of the terminal exposed portion is provided on the external connection terminal 29a by screen printing of, for example, a conductive carbon ink. A reinforcing film 29b for reinforcing strength of the external wiring line portion 29 is adhered to the surface of the insulating film 21 on the opposite side to the surface where the external connection terminal 29a is formed. The reinforcing film 29b can be configured similarly to the reinforcing film 46 described above. The external wiring line portion 29 illustrated in FIG. 25 passes through the molded body 30 and reaches the other main surface 32, and further protrudes from the other main surface 32 to the internal space IS.

(8) Method for Manufacturing Molded Article (8-1) Overview of Method for Manufacturing Molded Article As the method for manufacturing molded article of the fourth embodiment, the method for manufacturing molded article described in the first embodiment or the second embodiment or the manufacturing method described in the third embodiment can be used.

(8-2) Details of Method for Manufacturing Operation Panel 10

In the fourth embodiment, the crimped circuit film 20 and the decorative film 15 are prepared. When the decorative film 15 and the circuit film 20 are bonded, a viscous adhesive material film 56 is placed between the adhesive layer 18 on the design layer 17 and the insulating film 21 of the circuit film 20, and both films are bonded by thermocompression bonding. After both films are bonded, a pressure-defoaming process may be performed. The viscous adhesive material film 56 contains a material that exhibits a further strong adhesion force over time or by heat and ultraviolet light (UV) while being viscous. The viscous adhesive material film 56 is formed by, for example, coating acrylic, vinyl, polyamide polyester prepolymer with various composition materials on a thin nonwoven fabric.

Since steps similar to the steps of the manufacturing method described in the first embodiment, the second embodiment, or the third embodiment can be performed after the first step, the description of the subsequent steps will be omitted here. The circuit film 20 including the electrical circuits 22 on both surfaces may be used.

(9) Modified Examples (9-1) Modified Example A

Figure 28:
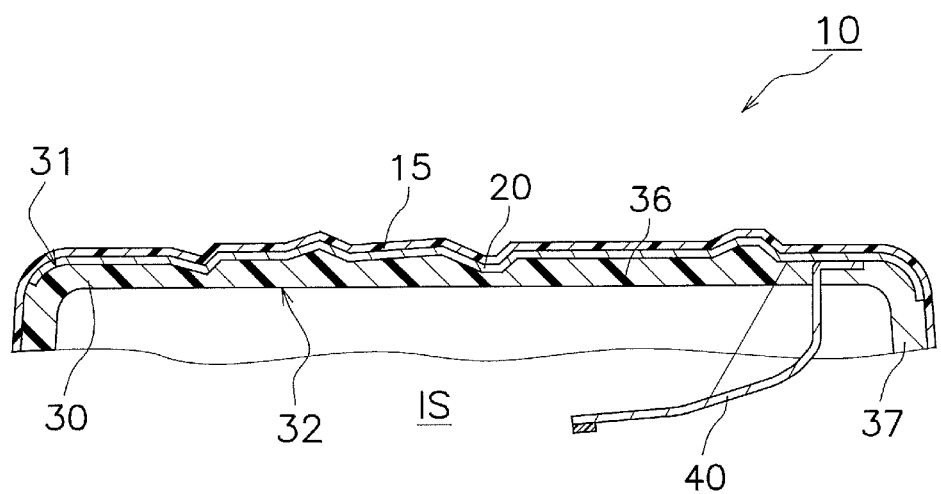
FIG. 28 is a schematic partially enlarged cross-sectional view illustrating an example of a molded article according to a modified example.
Figure 29:
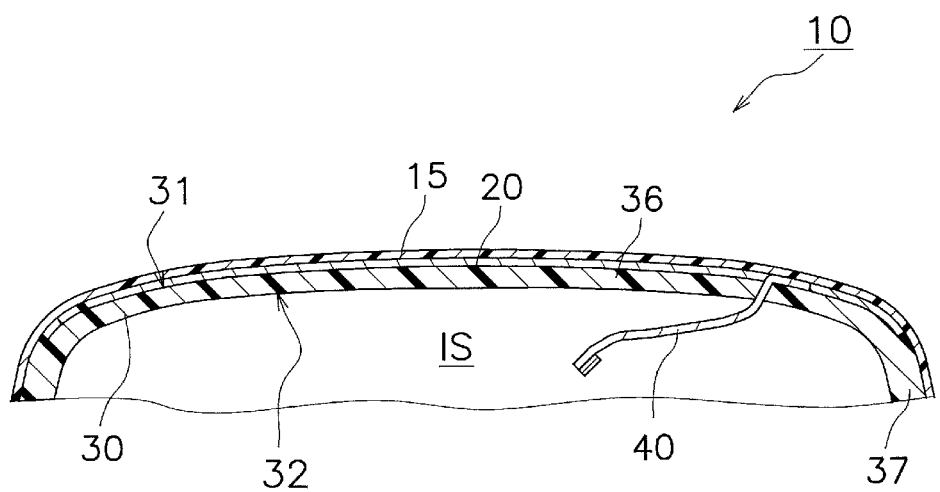
FIG. 29 is a schematic partially enlarged cross-sectional view illustrating another example of the molded article according to a modified example.

As illustrated in FIG. 28, the molded body 30 may have irregularities on the one main surface 31, and an interval between the one main surface 31 and the other main surface 32 may be different. As illustrated in FIG. 28, the circuit film 20 and the decorative film 15 integrally molded with the molded body 30 are molded along the one main surface 31 so as to have the same irregularity shape as the one main surface 31 having the irregularity shape. The upper wall 36 in FIG. 4 is on the flat plate, and the circuit film 20 has a two-dimensional shape that extends along one plane. However, as illustrated in FIG. 29, in the upper wall 36 of the molded body 30, the upper wall 36 may be molded to have a three-dimensional curved surface, and the circuit film 20 may have a three-dimensional shape that extends along of the curved surface as a whole.

(9-2) Modified Example B

Figure 30:
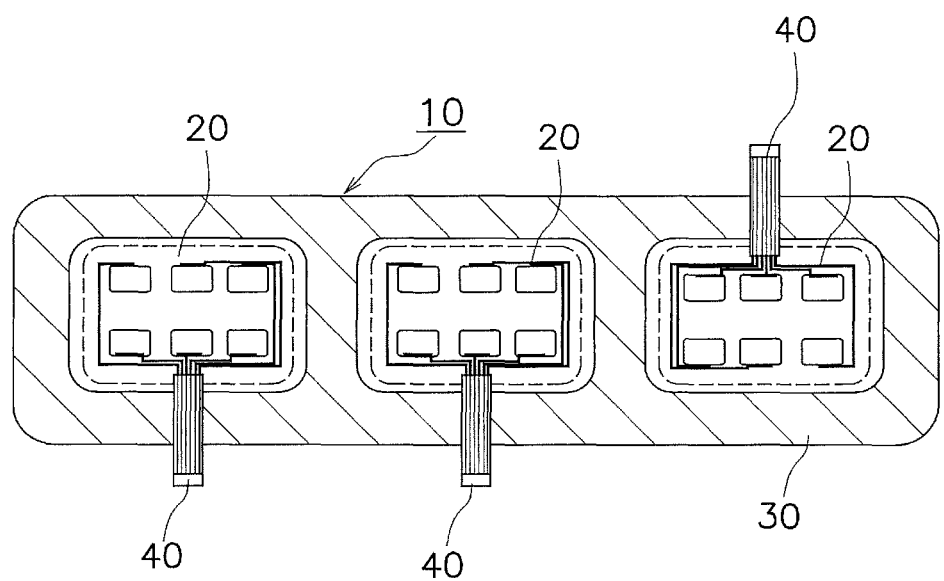
FIG. 30 is a schematic plan view illustrating another example of the molded article according to a modified example.
Figure 31:
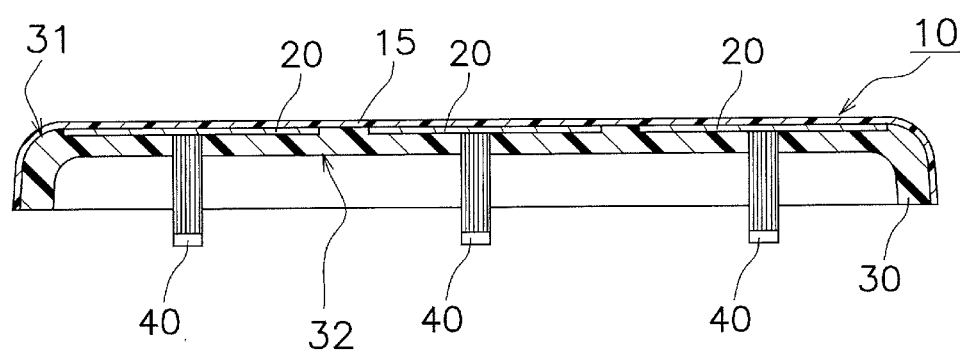
FIG. 31 is a schematic cross-sectional view illustrating the molded article of FIG. 30.

In the first embodiment to the third embodiment, the case where one circuit film 20 is disposed in the operation panel 10 as one molded article has been described. However, as illustrated in FIG. 30 and FIG. 31, a plurality of the circuit films 20 may be disposed in the operation panel 10 as one molded article. In this manner, when the plurality of circuit films 20 are provided, the FPC 40 may be mounted to each of the circuit films 20, or the FPC 40 may be shared with the plurality of circuit films 20. Furthermore, the number of FPCs may be larger than the number of circuit films 20.

(9-3) Modified Example C

In the first embodiment to the third embodiment, the case where the design layer 24 is provided in the circuit film 20 has been described. However, in the operation panel 10, the design layer 17 may be formed in the decorative film 15 different from the circuit film 20 illustrated in FIG. 32A and FIG. 32B, and the circuit film 20 may be covered with the decorative film 15 on the one main surface 31 of the molded body 30.

Figure 32A:
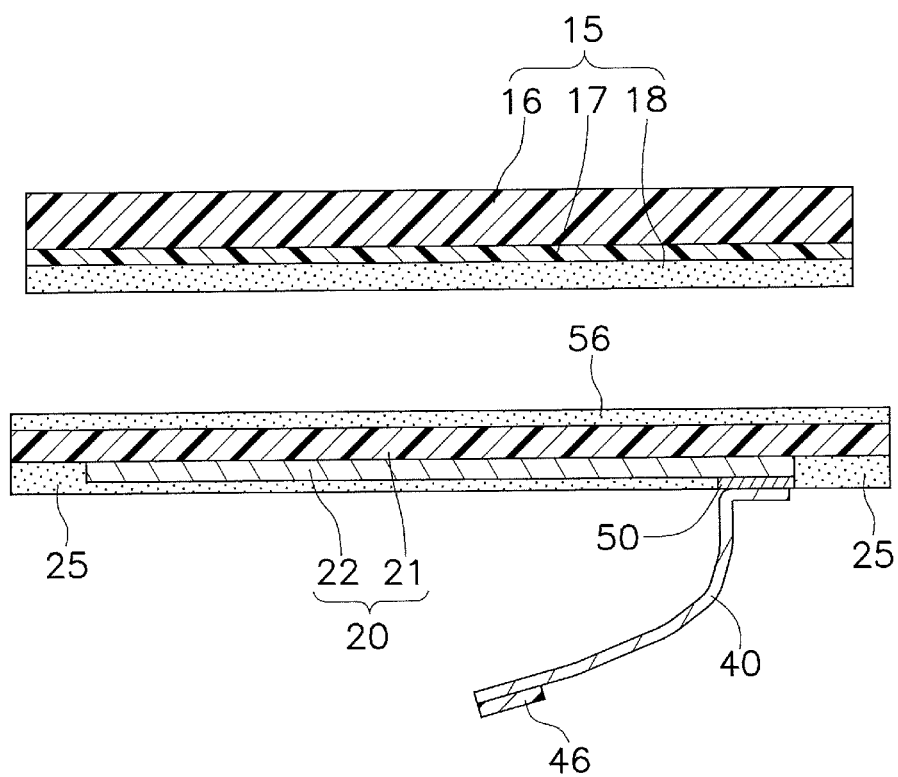
FIG. 32A is a schematic cross-sectional view illustrating an example of the circuit film and the decorative film before crimping.
Figure 32B:
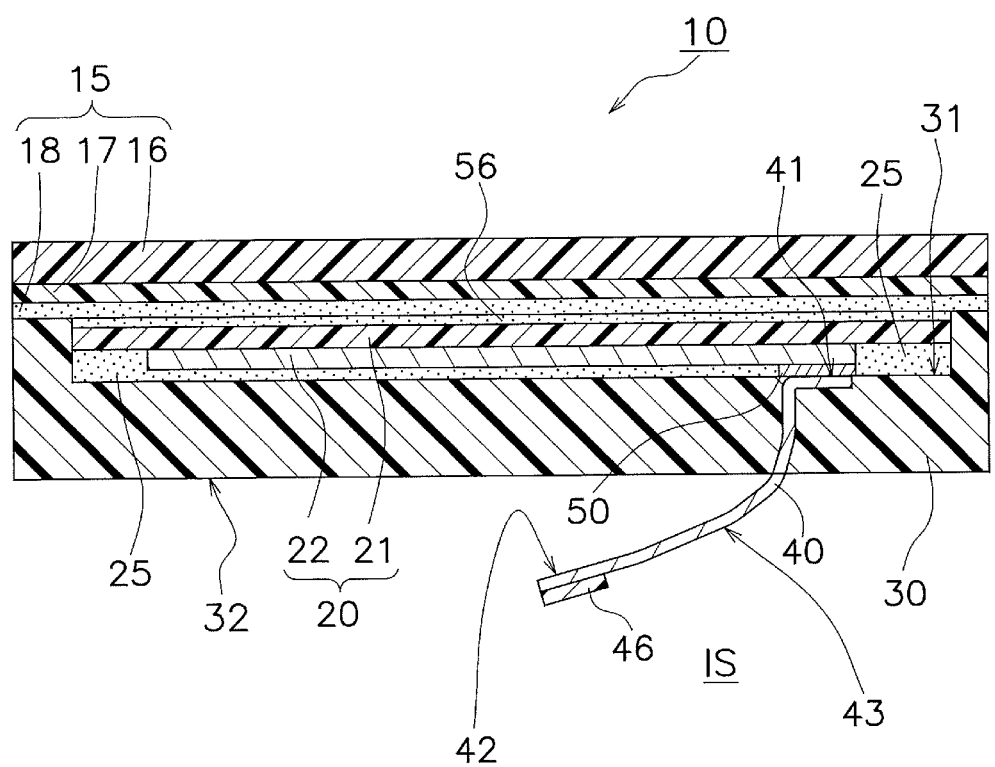
FIG. 32B is a schematic cross-sectional view illustrating an example of the circuit film and the decorative film after crimping.

The operation panel 10 illustrated in FIG. 32B includes the decorative film 15, the circuit film 20, the molded body 30, and the flexible printed wiring board 40.

As illustrated in FIG. 32B, the circuit film 20 of the operation panel 10 is located on the one main surface 31 of the molded body 30, and is integrally molded with the molded body 30. The decorative film 15 of the operation panel is located on the one main surface 31 of the molded body 30, and is integrally molded with the molded body 30. In this modified example, the decorative film 15 covers the entire circuit film 20 to decorate the appearance of the operation panel 10. However, in another electrical product to which the present invention is applied, the decorative film 15 may cover a portion of the circuit film 20. For example, on the decorative film 15, a design indicative of a function of the membrane switch 27, a design like a frame line indicating a range of the touch sensor 26, or a design like a background color that harmonizes with a color of the chassis 2 is provided. To prevent formation of an unnecessary electrical path of flowing a current from the circuit film 20 to the circuit film 20 through the decorative film 15, the decorative film 15 is preferably insulated on the side facing the circuit film 20.

In the molded body 30 in FIG. 32B, the one main surface 31 is located outside the breadmaker 1 as the electrical product, and the other main surface 32 is located inside the breadmaker 1. The inside of the chassis 2 of the breadmaker 1 is the internal space IS of the electrical product.

The FPC 40 passes through the inside of the molded body 30 and extends so as to reach the other main surface 32 of the molded body 30. The FPC 40 illustrated in FIG. 32B passes through the molded body 30 and reaches the other main surface 32, and further protrudes from the other main surface 32 to the internal space IS.

Similarly to the FPC 40 illustrated in FIG. 5, the FPC 40 illustrated in FIG. 32A includes the internal connection terminals 41, the external connection terminals 42, and the wiring lines 43.

In manufacturing the operation panel 10 illustrated in FIG. 32B, the circuit film 20, the FPC 40, and the anisotropic conductive film 50 illustrated in FIG. 32A are prepared. The FPC 40 is crimped to the circuit film 20 with the anisotropic conductive film 50. The adhesive layer 25 is not printed on the crimped portion with the FPC 40 in the electrical circuit 22, and the circuit is exposed. Thus, after adjusting alignment of the crimped portion where the circuit is exposed and the wiring line portions of the internal connection terminals 41 of the FPC 40, thermocompression bonding is performed on the wiring line portions of the internal connection terminals 41 and the crimped portion in the electrical circuit 22.

Here, a case in which the circuit film 20 and the FPC 40 are electrically connected with the anisotropic conductive film 50 will be described, but the anisotropic conductive paste may be used instead of the anisotropic conductive film 50.

As illustrated in FIG. 32B, the viscous adhesive material film 56 is placed on the insulating film 21 of the circuit film 20, and thus thermocompression bonding is performed on the decorative film 15 and the circuit film 20. After the circuit film 20 and the decorative film 15 are bonded by thermocompression bonding, a pressure-defoaming process may be performed.

Here, the case in which the circuit film 20 and the decorative film 15 are crimped has been described. However, crimping of the circuit film 20 and the decorative film 15 may be omitted, and, for example, the circuit film 20 and the decorative film 15 may be set to the first mold 101 separately.

In the first step, instead of the circuit film 20 of the first embodiment illustrated in FIG. 8, the crimped circuit film 20 and decorative film 15 are automatically set to the first mold 101 with, for example, the robot arm 190. The manufacturing process of the operation panel 10 after the circuit film 20 and the decorative film 15 are set to the first mold 101 can be performed, for example, similarly to the first embodiment. Therefore, the description of the manufacturing processes after the second step described in the first embodiment will be omitted here.

The operation panel 10 thus manufactured and described in FIG. 32B is incorporated into the chassis 2 of the breadmaker 1 as the electrical product. The controller 81, the liquid crystal display device 82, and the other electrical device 83 are installed in the chassis 2. The abutment of the external connection terminals 42 of the FPC 40 with the electrode of the controller 81 allows the operation panel 10 to electrically connect with the controller 81, the liquid crystal display device 82, and the other electrical device 83.

(9-4) Modified Example D

Figure 33:
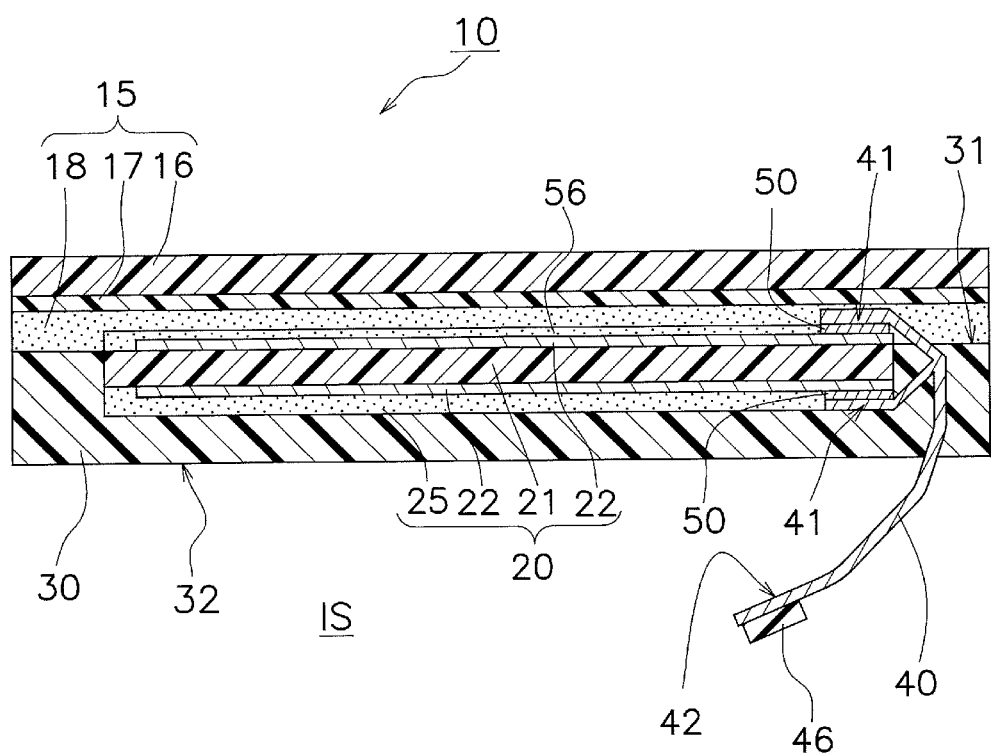
FIG. 33 is a schematic partially enlarged cross-sectional view for describing a circuit film including electrical circuits on both surfaces according to a modified example.
Figure 34:
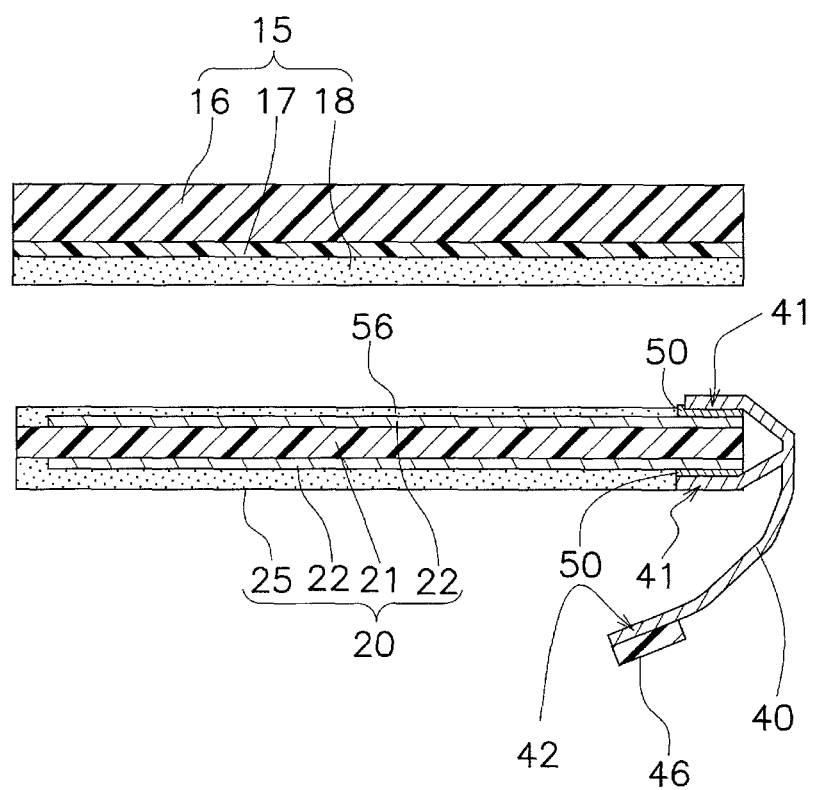
FIG. 34 is a schematic partially enlarged cross-sectional view illustrating the circuit film and a decorative film in FIG. 33 before crimping.

In the modified example C, the case where the electrical circuit 22 is formed on one surface of the circuit film 20 has been described. However, as illustrated in FIG. 33 and FIG. 34, for the molded article (the operation panel 10), the circuit film 20 in which the electrical circuits 22 are formed on both surfaces can be used. Each of the electrical circuits 22 and the FPC 40 are connected with the anisotropic conductive film 50 disposed on each of the surfaces. Accordingly, the FPC 40 has the two internal connection terminals 41 to handle both surfaces. To manufacture the molded article using the circuit film 20, for example, the circuit film 20 to which the FPC 40 is crimped is crimped (adhered) to the decorative film 15 illustrated in FIG. 34. The crimped circuit film 20 and decorative film 15 are set to the first mold 101 to ensure manufacturing the molded article (the operation panel 10) illustrated in FIG. 33 by the steps similar to the method for manufacturing molded article described in the above-described first embodiment to the third embodiment.

(9-5) Modified Example E

Figure 35:
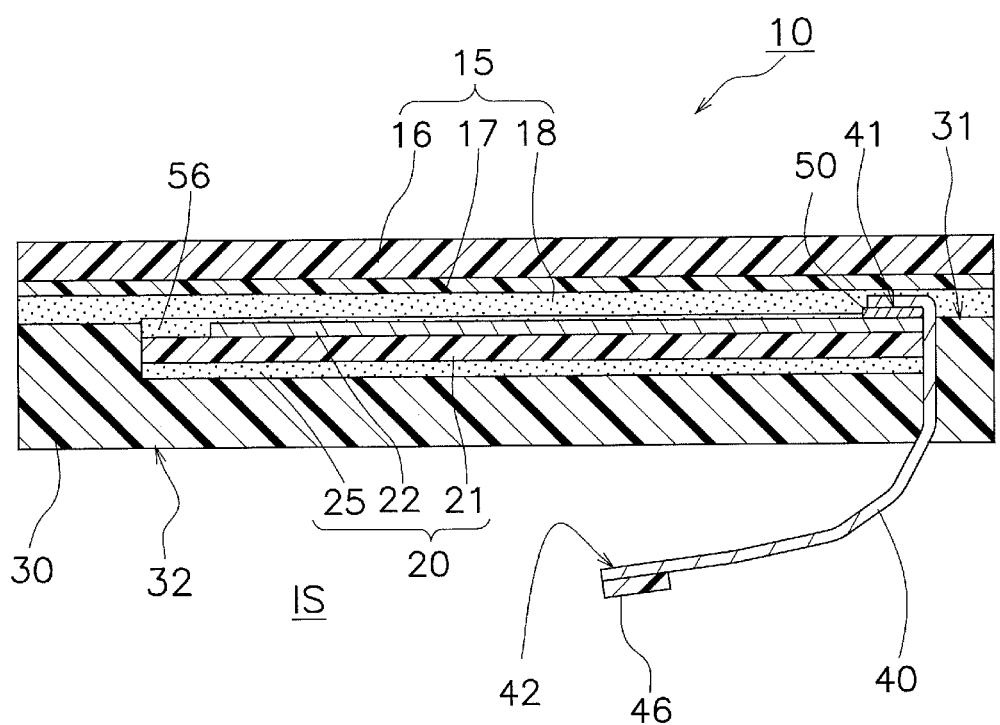
FIG. 35 is a schematic partially enlarged cross-sectional view illustrating another example of a molded article according to a modified example.
Figure 36:
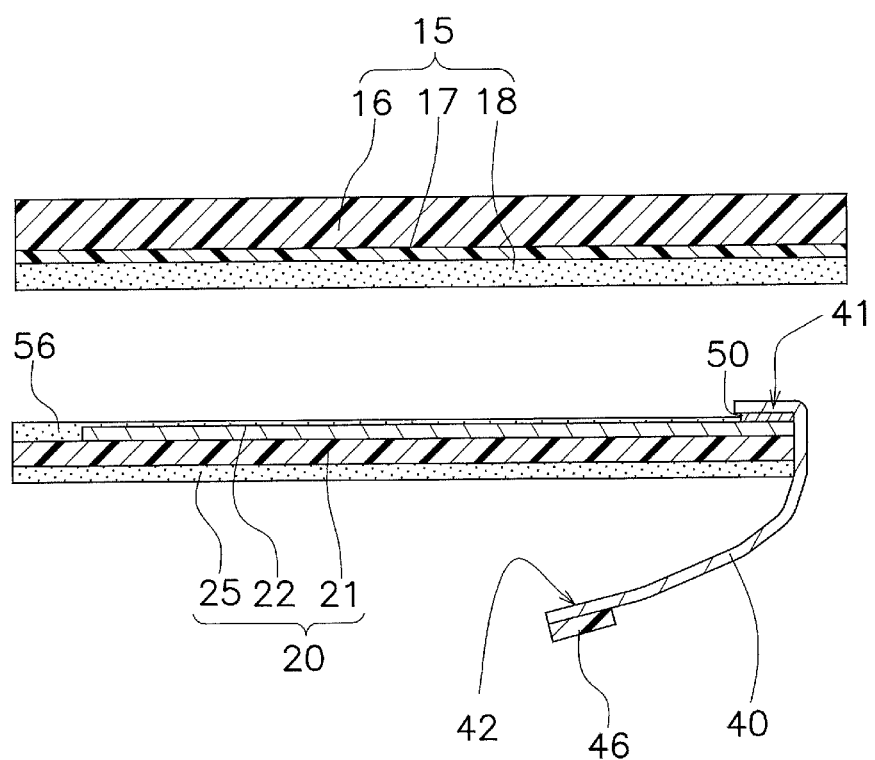
FIG. 36 is a schematic partially enlarged cross-sectional view of a circuit film and a decorative film in FIG. 35 before crimping.

In the modified example C, the case where the electrical circuit 22 is formed on the surface on the molded body 30 side of the circuit film 20 has been described. However, as illustrated in FIG. 35 and FIG. 36, the circuit film including the electrical circuits 22 on a surface opposite to the molded body can be used. To manufacture the molded article using the circuit film 20, for example, the circuit film 20 to which the FPC 40 is crimped is crimped (adhered) to the decorative film 15 illustrated in FIG. 36. The crimped circuit film 20 and decorative film 15 are set to the first mold 101 to ensure manufacturing the molded article (the operation panel 10) illustrated in FIG. 35 by the steps similar to the method for manufacturing molded article described in the above-described first embodiment to the third embodiment.

(9-6) Modified Example F

Figure 37A:
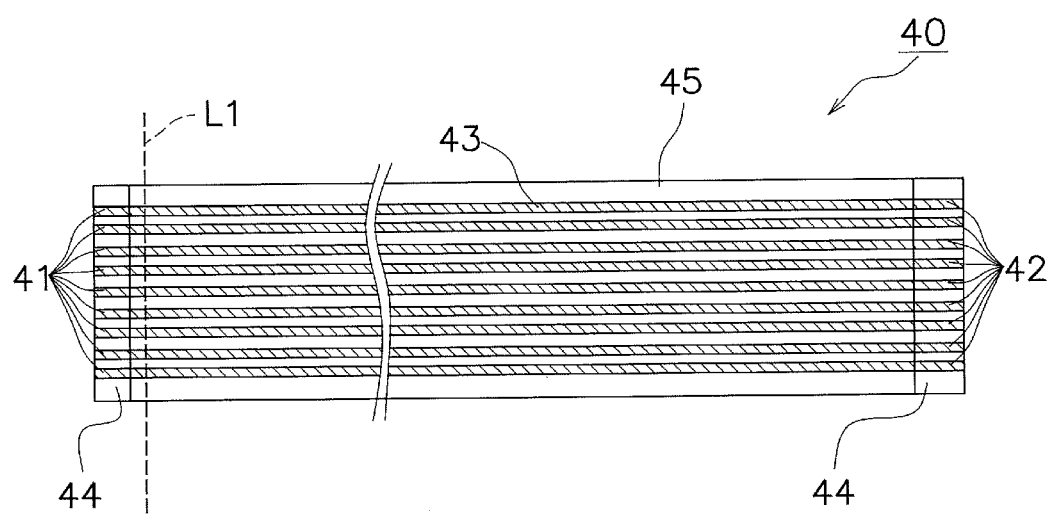
FIG. 37A is a partially cutaway plan view illustrating an example of an FPC according to a modified example.
Figure 37B:
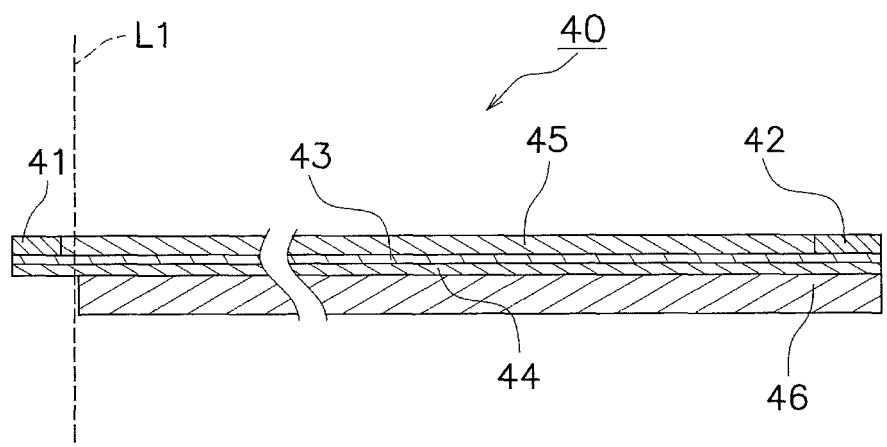
FIG. 37B is a schematic partially cutaway cross-sectional view of the FPC illustrated in FIG. 37A.
Figure 38:
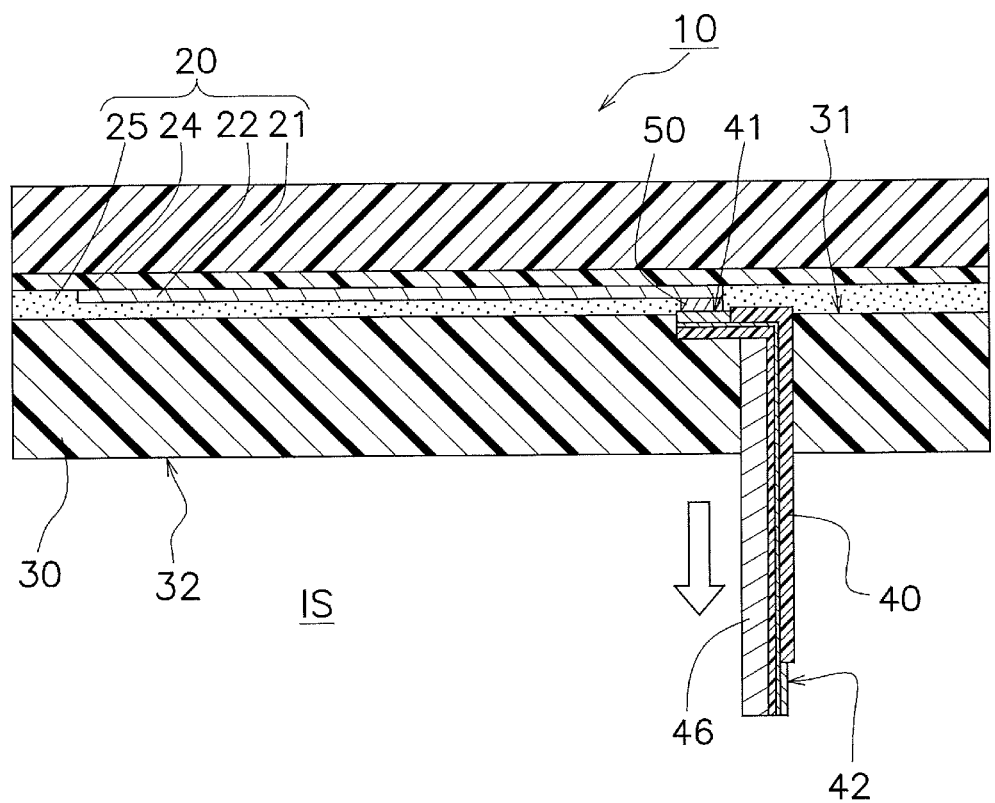
FIG. 38 is a schematic partially enlarged cross-sectional view illustrating an example of a molded article including the FPC in FIG. 37A.
Figure 39:
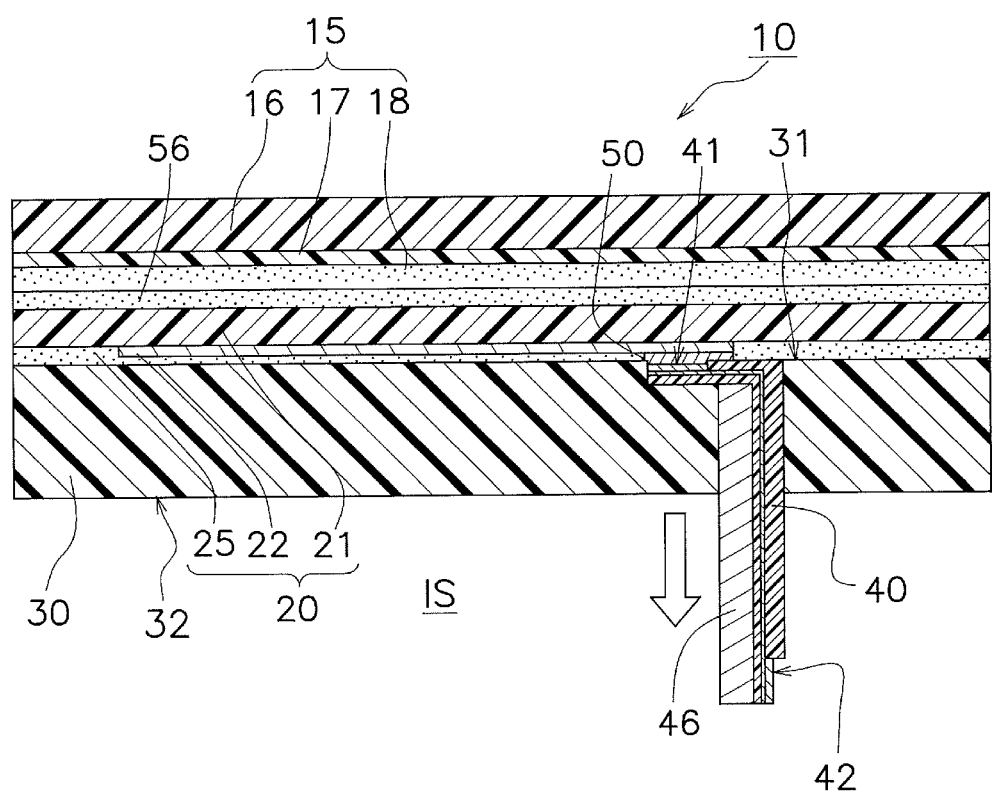
FIG. 39 is a schematic partially enlarged cross-sectional view illustrating another example of a molded article including the FPC in FIG. 37A.

The FPC 40 illustrated in FIG. 37A, FIG. 37B, FIG. 38, and FIG. 39 includes the reinforcing film 46 longer than those of the FPCs 40 of the first embodiment and the second embodiment. As illustrated in FIG. 38 and FIG. 39, a portion of the reinforcing film 46 is embedded into the molded body 30, and other portion of the reinforcing film 46 protrudes from the other main surface 32. As illustrated in FIG. 37A and FIG. 37B, the reinforcing film 46 is disposed up to the vicinity of the inner connection terminal 41. The FPC 40 is bent at a dashed line L1 illustrated in FIG. 37A and FIG. 37B.

The FPC 40 reinforced by the reinforcing film 46 is flexible, but has high rigidity. Accordingly, the FPC 40 can be inserted into a connector (not illustrated) of the electrical device in a direction indicated by the thick arrow (the direction in which the reinforcing film 46 extends). Note that a difference between the operation panel 10 illustrated in FIG. 38 and the operation panel illustrated in FIG. 39 is a difference whether the decorative film 15 and the circuit film 20 are integrally molded or formed by bonding.

(9-7) Modified Example G

Figure 40A:
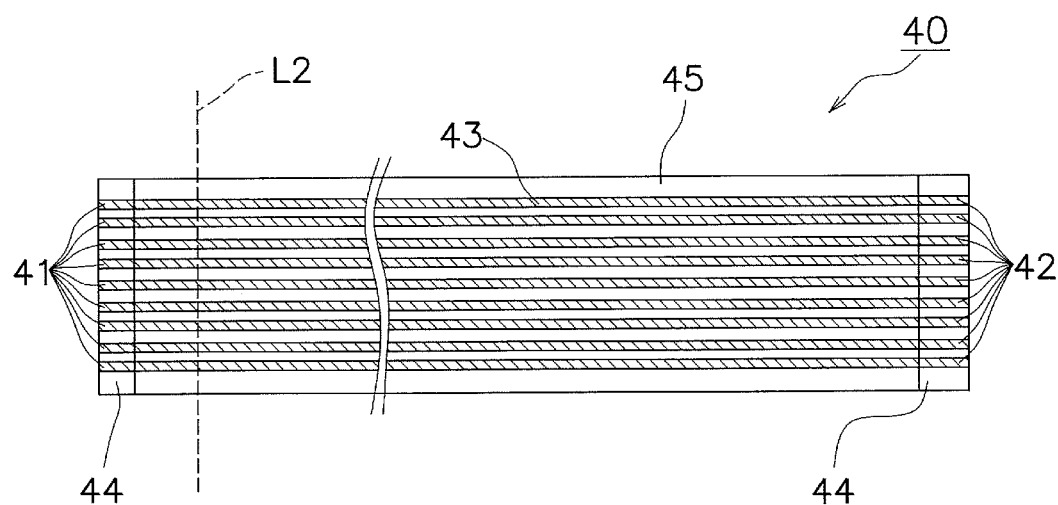
FIG. 40A is a partially cutaway plan view illustrating another example of the FPC according to a modified example.
Figure 40B:
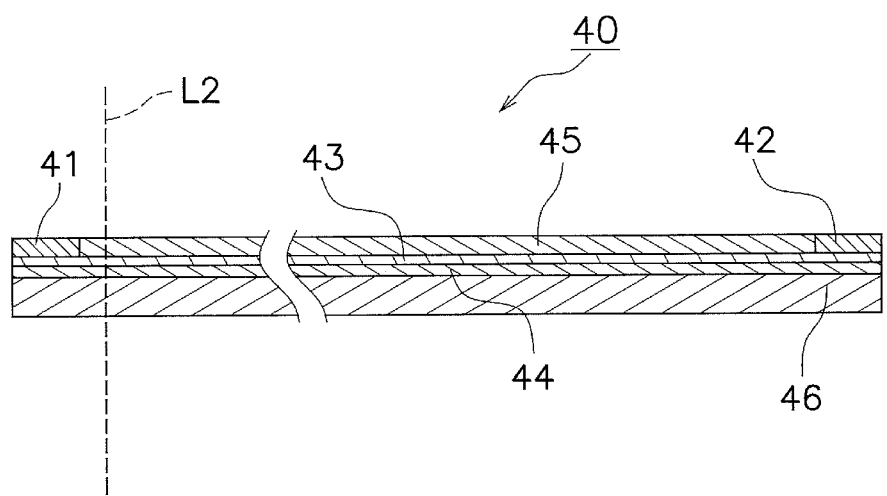
FIG. 40B is a schematic partially cutaway cross-sectional view of the FPC illustrated in FIG. 40A.
Figure 41:
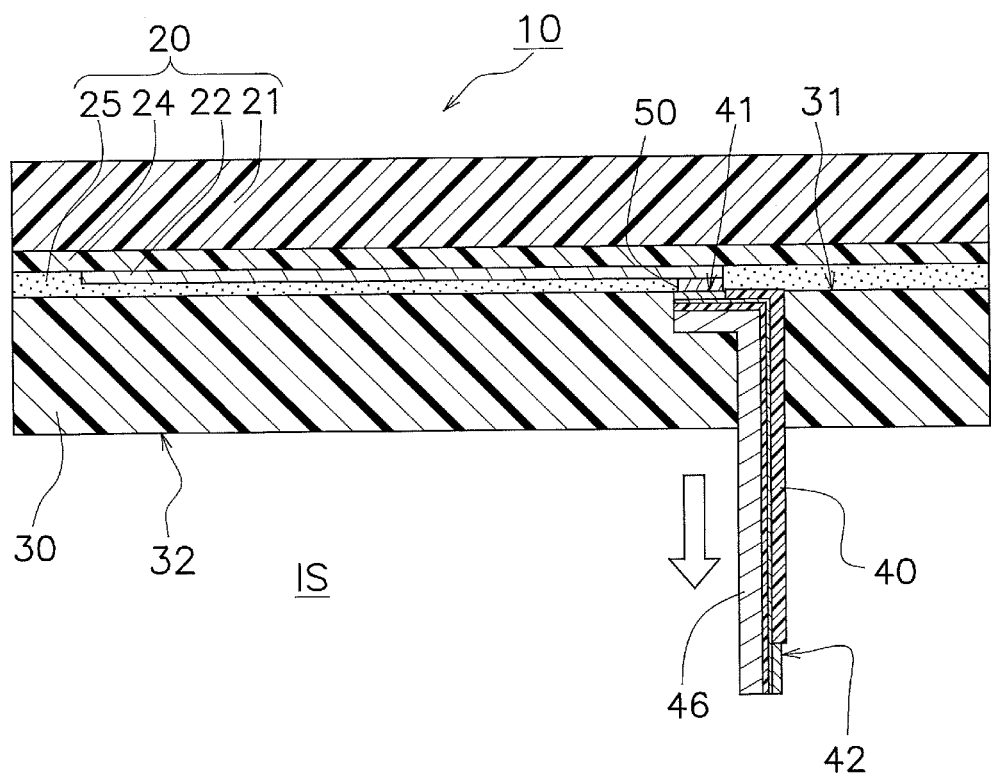
FIG. 41 is a schematic partially enlarged cross-sectional view illustrating an example of a molded article including the FPC in FIG. 40A.
Figure 42:
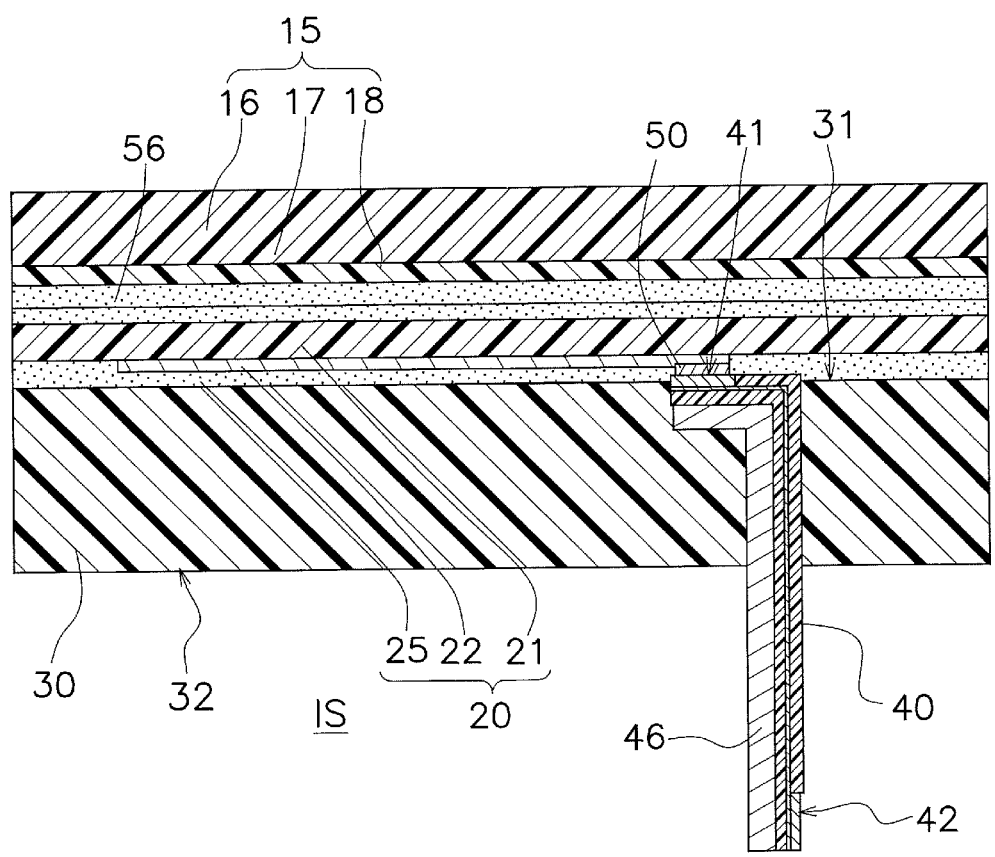
FIG. 42 is a schematic partially enlarged cross-sectional view illustrating another example of a molded article including the FPC in FIG. 40A.

The FPC 40 illustrated in FIG. 40A, FIG. 40B, FIG. 41, and FIG. 42 includes the reinforcing film 46 longer than those of the FPCs 40 of the first embodiment and the second embodiment. As illustrated in FIG. 41 and FIG. 42, a portion of the reinforcing film 46 is embedded into the molded body 30, and other portion of the reinforcing film 46 protrudes from the other main surface 32. As illustrated in FIG. 40A and FIG. 40B, the reinforcing film 46 is disposed on the entire surface of the FPC 40. The FPC 40 is bent at a dashed line L2 illustrated in FIG. 40A and FIG. 40B.

The FPC 40 reinforced by the reinforcing film 46 is flexible, but has high rigidity. Accordingly, the FPC 40 can be inserted into a connector (not illustrated) of the electrical device in a direction indicated by the thick arrow (the direction in which the reinforcing film 46 extends). Note that a difference between the operation panel 10 illustrated in FIG. 41 and the operation panel illustrated in FIG. 42 is a difference whether the decorative film 15 and the circuit film 20 are integrally molded or formed by bonding.

(9-8) Modified Example H

The FPCs 40 described in the first embodiment, the second embodiment, the third embodiment, and the modified examples can be replaced by flexible flat cables. The flexible flat cable flat cable is a thin and elongated cable formed by arranging a plurality of conductive wires having flat cross-sectional surfaces on the same surface and coating them with an insulator. The flexible flat cable used here preferably has the substantially rectangular cross-sectional shape when cut along the direction of arranging the conductors to be used for integral molding. The substantially rectangular shape is meant to include a rectangle whose angles are rounded and a rectangle with some irregularities in the surface. Note that to use the flexible flat cable or the FPC 40, the flexible flat cable or the FPC 40 may be connected to the electrical circuit 22 of the circuit film 20 by soldering.

(9-9) Modified Example I

The operation panel 10 as the molded article according to each of the embodiments is a still object that does not change in shape even when time elapses. However, the molded article according to the present invention is not limited to a still object, and may include a movable portion. For example, a body made of resin of a robot toy moved by a motor can be configured using the molded article according to the present invention including a movable portion.

(9-10) Modified Example J

In the electrical product (the breadmaker 1) of each of the embodiments, the one main surface 31 of the molded body 30 is located outside the chassis 2, and the other main surface 32 is located inside the chassis 2. However, in contrast to this, in another electrical product to which the present invention is applied, the external connection terminal can be exposed to the outside of the chassis such that the one main surface of the molded body is located inside the chassis and the other main surface is located outside the chassis.

(9-11) Modified Example K

Figure 43:
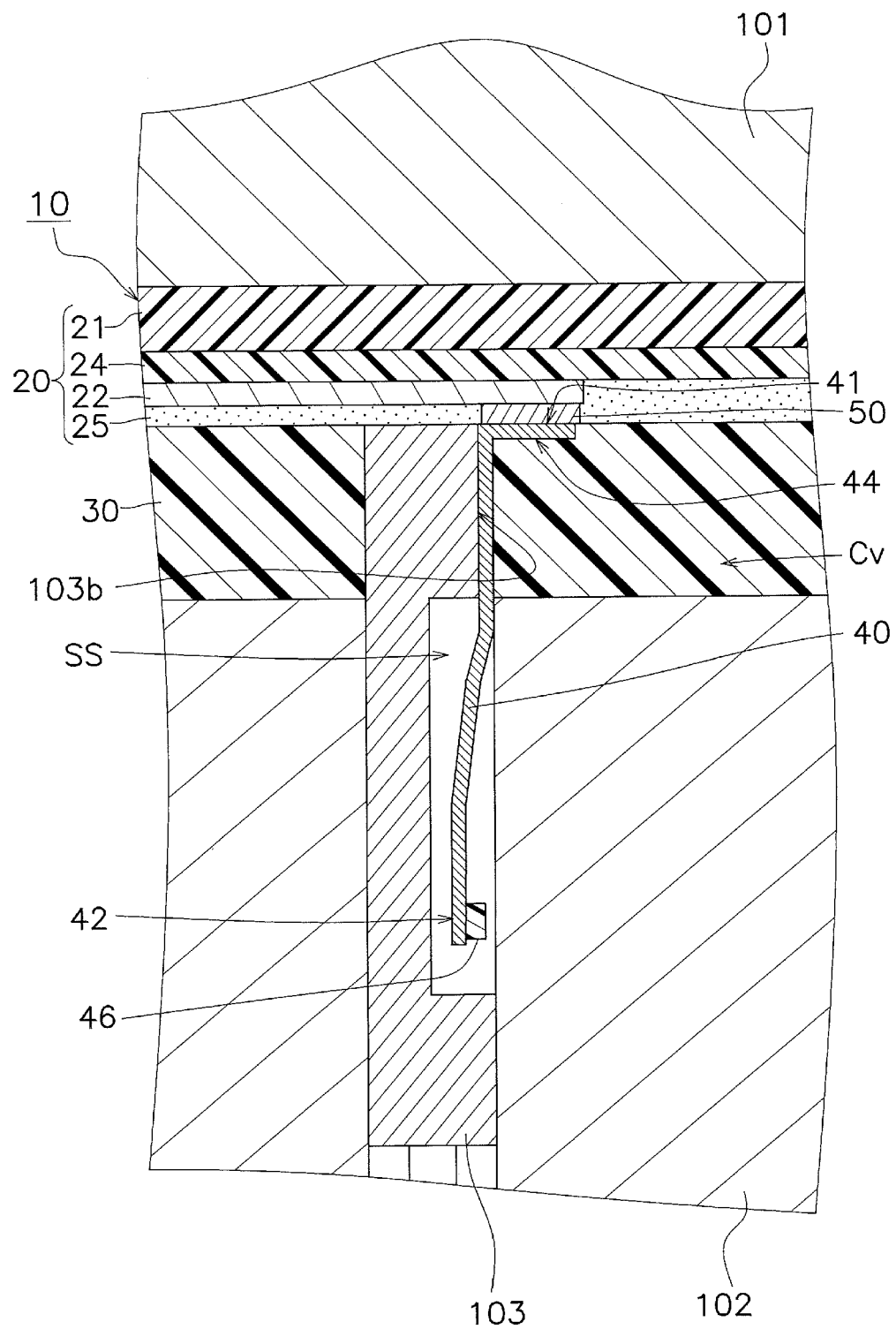
FIG. 43 is a partially enlarged cross-sectional view for describing another method for manufacturing molded article according to a modified example.

In the methods for manufacturing molded article of the first embodiment and the second embodiment, the case where the storage pin 103 is pressed against the FPC 40 has been described. However, as illustrated in FIG. 43, the abutment surface 103*b* of the storage pin 103 may be fitted to the FPC 40 without pressing the storage pin 103 against the FPC 40. The storage pin 103 illustrated in FIG. 43 abuts on the FPC 40 and presses the circuit film 20 against the first mold 101. In the manufacturing method illustrated in FIG. 43 as well, the cavity Cv in which the molded body 30 is formed and the storage space SS are partitioned by the second mold 102, the storage pin 103, and the flexible printed wiring board 40.

An adhesive may be applied on the base film 44 opposite to the portion where the internal connection terminals 41 of the FPC 40 are formed. This adhesive adheres the base film 44 of the FPC 40 and the molded body 30.

(10) Characteristics (10-1)

In the operation panel 10 as the molded article described above, when the FPC 40 or the flexible flat cable passes through the inside of the molded body 30, an end portion 10*a* (see FIG. 1) as the periphery of the one main surface 31 and the other main surface 32 of the molded body 30 need not be used for handling of the FPC 40 or the flexible flat cable. The external connection terminal 42 of the FPC 40 or the flexible flat cable is exposed to the internal space IS of the chassis 2, and handling of the wiring line 43 up to the external connection terminal 42 for electrical connection with the circuit film integrally molded with the molded body 30 is easy.

(10-2)

In the operation panel 10 as the molded article described above, when the external wiring line portion 29 of the circuit film 20 passes through the inside of the molded body 30, the end portion 10*a* (see FIG. 1) as the periphery of the one main surface 31 and the other main surface 32 of the molded body need not be used for handling of the external wiring line portion 29. The external connection terminal 29*a* of the external wiring line portion 29 is exposed to the internal space IS of the chassis 2, and handling of the external wiring line portion 29 up to the external connection terminal 29*a* for electrical connection with the circuit film 20 integrally molded with the molded body 30 is easy.

(10-3)

The circuit film 20 described with reference to FIG. 33 and FIG. 34 includes the electrical circuits 22 on both surfaces of the insulating film 21. Compared with the circuit film 20 including the electrical circuit 22 on only one surface by the same area, in the circuit film 20 including the electrical circuits 22 on both surfaces, the many electrical circuits 22 can be easily formed.

(10-4)

The appearance of the operation panel 10 (an example of the molded article) in which at least a portion of the circuit film 20 is covered with the decorative film 15 is decorated with the decorative film 15, allowing the exterior view to be beautifully adjusted. At the same time, by covering at least a portion of the circuit film 20 with the decorative film 15, the circuit film 20 can be protected with the decorative film 15.

(10-5)

In the operation panel 10 of the third embodiment illustrated in FIG. 19, the external connection terminal 42 is fixed to the other main surface 32 of the molded body 30. Therefore, since the position of the external connection terminal 42 is always maintained constant with respect to the molded body 30, connection to the external connection terminal 42 is easy. Note that the distal end portion 46*e* protruding from the other main surface 32 may be cut and removed after molding the molded body 30 in the case of being an obstacle.

(10-6)

The breadmaker 1 as one example of the above-described electrical product includes the chassis 2 including the operation panel 10 as the molded article and the electrical device 3. The electrical device 3 is disposed in the chassis 2. The electrical device 3 is connected to the external connection terminals 42 in the chassis 2. Therefore, the end portion 10*a* (see FIG. 1) of the operation panel 10 need not be used for handling of the FPC 40, the flexible flat cable, or the external wiring line portion 29 of the circuit film 20. As a result, the breadmaker 1 can improve a sealing property of the chassis 2 and improve the protection of the electrical device 3. For example, even when water splashes on the breadmaker 1, splash of the water on the electrical device 3 in the operation panel 10 and the chassis 2 is prevented.

(10-7)

In the method for manufacturing molded article of the first embodiment described with reference to FIG. 8 to FIG. 14 or the method for manufacturing molded article of the second embodiment described with reference to FIG. 15 to FIG. 18, the FPC 40, the flexible flat cable, or the external wiring line portion 29 of the circuit film 20 is stored in the storage space SS, and the injection molding of the molded body 30 can be performed while the FPC 40, the flexible flat cable, or the external wiring line portion 29 is treated so as not to be immersed in the molten resin 200. This allows manufacturing the operation panel 10 (an example of the molded article) in which the FPC 40, the flexible flat cable, or the external wiring line portion 29 passes through the inside of the molded body 30. Additionally, the manufacturing method separates the cavity Cv from the storage space SS, thus preventing the molten resin 200 from entering into the storage space SS and causing a difficulty in the subsequent injection molding. This allows easily manufacturing the operation panel 10 (an example of the molded article) in which handling of the external wiring line portion 29 or the wiring line 43 up to the external connection terminal 29a of the circuit film 20 integrally molded with the molded body 30 or the external connection terminal 42 is easy.

(10-8)

In the method for manufacturing molded article of the first embodiment or the second embodiment, the molten resin 200 is further injected into the gap Gp generated by retreat of the storage pin 103. Therefore, the portion of the molded body 30 where the storage pin 103 is disposed can be filled with the resin, and the portion can be prevented from being depressed. As a result, deterioration of the strength due to the depression of the molded body 30 and deterioration of the beautiful appearance of the chassis 2 due to shrinkage of the resin can be suppressed.

(10-9)

In the method for manufacturing molded article of the third embodiment described with reference to FIG. 21 to FIG. 24, the FPC 40, the flexible flat cable, or the external wiring line portion 29 can be supported by the storage pin 103 such that the FPC 40, the flexible flat cable, or the external wiring line portion 29 of the circuit film 20 is not immersed in the molten resin 200. This allows manufacturing the operation panel 10 (an example of the molded article) in which the FPC 40, the flexible flat cable, or the external wiring line portion 29 passes through the inside of the molded body 30. Additionally, in this manufacturing method, the external wiring line portion 29, the FPC 40, or the flexible flat cable is bent by pressing so as to have the shape after molding, thus ensuring exposing the external connection terminals 29a and 42 as a portion of the other main surface 32 of the molded body 30. The molten resin 200 is further injected into the gap Gp generated by retreat of the storage pin 103. Therefore, the portion of the molded body 30 where the storage pin 103 is disposed can be filled with the resin, and the portion can be prevented from being depressed. As a result, deterioration of the strength due to the depression of the molded body 30 and deterioration of the beautiful appearance of the chassis 2 due to shrinkage of the resin can be suppressed.

(10-10)

Simultaneously with integrally molding the decorative film 15 with the molded body together with the circuit film 20, the heat and the pressure of the molten resin 200 are applied to the decorative film 15 and the circuit film 20, thus ensuring firmly adhering the decorative film 15 and the circuit film 20 integrally molded with the molded body 30.

(10-11)

When the FPC 40 and the circuit film 20 are adhered with the anisotropic conductive film or the anisotropic conductive paste by heat and pressure of the molten resin 200 simultaneously with integral molding of the FPC 40 with the molded body 30 together with the circuit film 20, the FPC 40 and the circuit film 20 integrally molded with the molded body 30 can be firmly adhered. In particular, the contact portion at which the circuit film 20 and the FPC 40 are crimped is sandwiched between the film and the molded resin, and the most of the FPC 40 is sealed by the molded body 30. Therefore, external force is less likely to be applied to the contact portion, and the contact portion is less likely to peel. In addition, since intrusion of external air into the contact portion is blocked by the film and the molded resin, the molded article manufactured in this manner has excellent chemical durability.

Although one embodiment of the present invention has been described above, the present invention is not limited to the above-described embodiments, and various modifications can be made without departing from the gist of the invention. In particular, the plurality of embodiments and modified examples described herein can be combined arbitrarily with one another as necessary.

REFERENCE SIGNS LIST

1 Breadmaker (example of an electrical product)
2 Chassis
3 Electrical device
10 Operation panel (example of a molded article)
15 Decorative film
20 Circuit film
21 Insulating film
22 Electrical circuit
29 External wiring line portion
29a External connection terminal
30 Molded body
40 Flexible printed wiring board (FPC)
41 Internal connection terminal
42 External connection terminal
101 First mold
102 Second mold
103 Storage pin
Cv Cavity
Gp Gap
SS Storage space

The invention claimed is:
1. A molded article comprising:
a first circuit film that includes an insulating film and an electrical circuit formed on the insulating film;
a molded body having a first main surface and a second main surface facing the first main surface, the molded body being made of an injection molding resin integrally molded with the first circuit film located on the first main surface so as to cover an entire surface of the first circuit film;
a flexible printed wiring board or a flexible flat cable that includes, an internal connection terminal, an external connection terminal and a flexible wiring line; and
an anisotropic conductive film placed between the electrical circuit and the internal connection terminals of the flexible printed wiring board or the flexible flat cable for electrically connecting the electrical circuit and the flexible printed wiring board or the flexible flat cable, wherein
the external connection terminal is electrically connected to the electrical circuit of the first circuit film via the anisotropic conductive film, and the external connection terminal is exposed outside from the second main surface of the molded body,
the internal connection terminal and the anisotropic conductive film are located between the first main surface of the molded body and the first circuit film, and
the wiring line connects the external connection terminal and the electrical circuit via the anisotropic conductive film, and the wiring line is sandwiched between injection molding resins and extends to reach the second main surface.

2. The molded article according to claim 1, wherein a part passing through the inside of the injection molding resin of the flexible printed wiring board or the flexible flat cable is sandwiched between the injection molding resins.

3. The molded article according to claim 1, wherein the flexible printed wiring board is a portion of the first circuit film.

4. The molded article according to claim 1, wherein
the first circuit film includes the electrical circuits on both surfaces of the insulating film; and
the flexible printed wiring board or the flexible flat cable includes an internal connection terminal electrically connected to the electrical circuit on each of the surfaces of the insulating film.

5. The molded article according to claim 1, further comprising
a decorative film insulated on a side facing the first circuit film, the decorative film being disposed on the first main surface to cover at least a portion of the first circuit film and decorate an appearance, the decorative film being integrally molded with the molded body.

6. The molded article according to claim 1, wherein
the external connection terminal is substantially a portion of the second main surface, and the external connection terminal is fixed with the molded body.

7. The molded article according to claim 6, wherein the flexible printed wiring board or the flexible wiring line includes a reinforcing film to increase a rigidity of a portion where the external connection terminal is formed.

8. The molded article according to claim 7, wherein a tip end of the reinforcing film protrudes from the second main surface.

9. The molded article according to claim 7, wherein the reinforcing film is embedded into the molded body.

10. The molded article according to claim 9, wherein the reinforcing film is disposed into the molded body to an inner connection terminal of the flexible printed wiring board or the flexible wiring line.

11. The molded article according to claim 7, wherein the reinforcing film is disposed into the molded body along an entire surface of the flexible printed wiring board.

12. An electrical product comprising:
a chassis including the molded article according to claim 1; and
an electrical device disposed in the chassis and connected to the external connection terminal.

13. The molded article according to claim 1, further comprising:
a second circuit film that also includes an insulating film and an electrical circuit formed on the insulating film, wherein the molded body made of the injection molding resin integrally molded with the second circuit film; and
an additional flexible printed wiring board or a flexible flat cable that includes an external connection terminal and a flexible wiring line, the external connection terminal being electrically connected to the respective electrical circuit of the second circuit film, the external connection terminal being exposed outside from the second main surface of the molded body, the wiring line connecting the external connection terminal and the respective electrical circuit, the wiring line passing through an inside of the injection molding resin and extending to reach the second main surface.

14. A method for manufacturing molded article as claimed in claim 1,
comprising:
setting a circuit film including an insulating film and an electrical circuit formed on the insulating film to a first mold;
storing a flexible printed wiring board or a flexible flat cable standing from the circuit film in a storage space provided with a storage pin, clamping the first mold and a second mold, and separating a cavity formed with the first mold and the second mold from the storage space;
injecting a molten resin into the cavity and forming a molded body integrally molded with the circuit film; and
injecting the molten resin in a first state in which the storage pin is fitted to the flexible printed wiring board or the flexible flat cable when the molded body is formed, and further injecting a molten resin into a gap generated by retreat of the storage pin in a second state in which the storage pin is retreated from the first state.

15. The method for manufacturing the molded article according to claim 14, the method comprising:
crimping a decorative film and the circuit film;
setting the decorative film to the first mold together with the circuit film; and
injecting a molten resin into the cavity, and applying heat and pressure to the decorative film and the circuit film simultaneously with integrally molding the decorative film with the molded body together with the circuit film.

16. The method for manufacturing a molded article according claim 14, the method comprising:
crimping the circuit film and the flexible printed wiring board with an anisotropic conductive film or an anisotropic conductive paste;
setting the flexible printed wiring board to the first mold together with the circuit film; and
injecting a molten resin into the cavity, and applying heat and pressure to the flexible printed wiring board and the circuit film with the molten resin simultaneously with integrally molding the flexible printed wiring board with the molded body together with the circuit film.

* * * * *